(12) United States Patent
Kim et al.

(10) Patent No.: US 11,805,710 B2
(45) Date of Patent: Oct. 31, 2023

(54) METHOD OF FABRICATING THREE-DIMENSIONAL SEMICONDUCTOR MEMORY DEVICE

(71) Applicant: Samsung Electronics Co., Ltd., Suwon-si (KR)

(72) Inventors: Heejung Kim, Gimpo-si (KR); Taehong Min, Suwon-si (KR); Chorong Park, Seongnam-si (KR); Joohee Seo, Seoul (KR); Eunsuk Hwang, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 179 days.

(21) Appl. No.: 17/395,043

(22) Filed: Aug. 5, 2021

(65) Prior Publication Data
US 2022/0190242 A1     Jun. 16, 2022

(30) Foreign Application Priority Data

Dec. 11, 2020 (KR) .................. 10-2020-0173727

(51) Int. Cl.
*H10N 70/00* (2023.01)
*H10B 63/00* (2023.01)

(52) U.S. Cl.
CPC ........... *H10N 70/063* (2023.02); *H10B 63/84* (2023.02); *H10N 70/068* (2023.02)

(58) Field of Classification Search
CPC .................................................. H10N 70/063
See application file for complete search history.

(56) References Cited

U.S. PATENT DOCUMENTS

| | | | |
|---|---|---|---|
| 8,178,442 B2 | 5/2012 | Park et al. | |
| 9,379,017 B1 | 6/2016 | Sung et al. | |
| 9,704,721 B2 | 7/2017 | Lee et al. | |
| 9,773,844 B2 * | 9/2017 | Ravasio | G11C 5/063 |
| 9,859,224 B2 | 1/2018 | Conklin et al. | |
| 9,911,828 B2 | 3/2018 | Kim et al. | |
| 9,960,123 B2 | 5/2018 | Wang et al. | |
| 2012/0139086 A1 | 6/2012 | Kim et al. | |
| 2018/0358549 A1 * | 12/2018 | Bernhardt | H10N 70/021 |

(Continued)

FOREIGN PATENT DOCUMENTS

KR        101834253 B1      3/2018

*Primary Examiner* — Mounir S Amer
(74) *Attorney, Agent, or Firm* — Harness, Dickey & Pierce, P.L.C.

(57) ABSTRACT

A method of fabricating a three-dimensional semiconductor memory device includes forming a cell stack layer covering key and cell regions of a substrate and including a variable resistance layer and a switching layer, forming key mask patterns on the cell stack layer of the key region and cell mask patterns on the cell stack layer of the cell region, and simultaneously forming a plurality of key patterns on the key region and a plurality of memory cells on the cell region by etching the cell stack layer using the key and cell mask patterns as an etching mask. Each memory cell includes a variable resistance pattern and a switching pattern formed by etching the variable resistance layer and the switching layer. Each key pattern includes a dummy variable resistance pattern and a dummy switching pattern formed by etching the variable resistance layer and the switching layer.

20 Claims, 39 Drawing Sheets

(56) References Cited

U.S. PATENT DOCUMENTS

2019/0206725 A1    7/2019  Chu et al.
2021/0104576 A1*   4/2021  Lee ..................... H10B 63/24
2022/0293680 A1*   9/2022  Han ..................... H10B 63/20

* cited by examiner

METHOD OF FABRICATING THREE-DIMENSIONAL SEMICONDUCTOR MEMORY DEVICE

CROSS-REFERENCE TO RELATED APPLICATION

This U.S. nonprovisional application claims priority under 35 U.S.C § 119 to Korean Patent Application No. 10-2020-0173727 filed on Dec. 11, 2020 in the Korean Intellectual Property Office, the disclosure of which is hereby incorporated by reference in its entirety.

BACKGROUND

Inventive concepts relate to a method of fabricating a three-dimensional semiconductor memory device, and more particularly, to a method of fabricating a three-dimensional semiconductor memory device including variable resistance memory cells.

According to demand for high capacity and low power consumption of a memory device, research is being conducted on next-generation memory devices that are non-volatile and do not require a refresh operation. The next-generation memory devices may be required to have high integration characteristics of DRAM (dynamic random access memory), nonvolatile characteristics of flash memory, and/or high speed of SRAM (static RAM).

Next-generation semiconductor memory devices, for example, ferroelectric random access memory (FRAM), magnetic random access memory (MRAM) and phase change random access memory (PRAM), are recently being developed to meet the trend of high performance and low power of the semiconductor memory device. The next-generation semiconductor memory devices may include a material having characteristics where the resistance changes depending on applied electric current or voltage and the resistance may be maintained even when the electric current or voltage supply is interrupted.

Further, semiconductor devices may require an increase in integration, and thus three-dimensional semiconductor memory devices having three-dimensionally arranged memory cells have been proposed.

SUMMARY

Some embodiments of inventive concepts provide a method of fabricating a three-dimensional semiconductor memory device capable of minimizing process failure and being easily manufactured.

According to some embodiments of inventive concepts, a method of fabricating a three-dimensional semiconductor memory device may include: providing a substrate that includes a key region and a cell region; forming a cell stack layer on the substrate, the cell stack layer covering the key region and the cell region, the cell stack layer including a variable resistance layer and a switching layer that are vertically stacked on the substrate; forming a plurality of key mask patterns and a plurality of cell mask patterns on the substrate, the plurality of key mask patterns being spaced apart from each other in a first direction on the cell stack layer on the key region, and the plurality of cell mask patterns being spaced apart from each other in the first direction on the cell stack layer on the cell region; and simultaneously form a plurality of key patterns on the key region and a plurality of memory cells on the cell region by etching the cell stack layer using the plurality of key mask patterns and the plurality of cell mask patterns as an etching mask. Each of the plurality of memory cells may include a variable resistance pattern and a switching pattern that may be formed by etching the variable resistance layer and the switching layer. Each of the plurality of key patterns may include a dummy variable resistance pattern and a dummy switching pattern that may be formed by etching the variable resistance layer and the switching layer.

According to some embodiments of inventive concepts, a method of fabricating a three-dimensional semiconductor memory device may include: providing a substrate that includes a key region and a cell region; forming a cell stack layer on the substrate, the cell stack layer covering the key region and the cell region, the cell stack layer including a variable resistance layer and a switching layer that are vertically stacked on the substrate; forming a plurality of key mask patterns on the cell stack layer on the key region and a plurality of cell mask patterns on the cell stack layer on the cell region; and forming a plurality of key patterns on the key region and a plurality of memory cells on the cell region by etch the cell stack layer using the plurality of key mask patterns and the plurality of cell mask patterns as an etching mask. Each of the plurality of memory cells may include a variable resistance pattern and a switching pattern that may be formed by etching the variable resistance layer and the switching layer. Each of the plurality of key patterns may include a material that is the same as a material of at least one of the variable resistance pattern and the switching pattern.

DETAILED DESCRIPTION OF EMBODIMENTS

Some embodiments of inventive concepts will be described below in detail in conjunction with the accompanying drawings to aid in clearly understanding inventive concepts.

Figure 1:
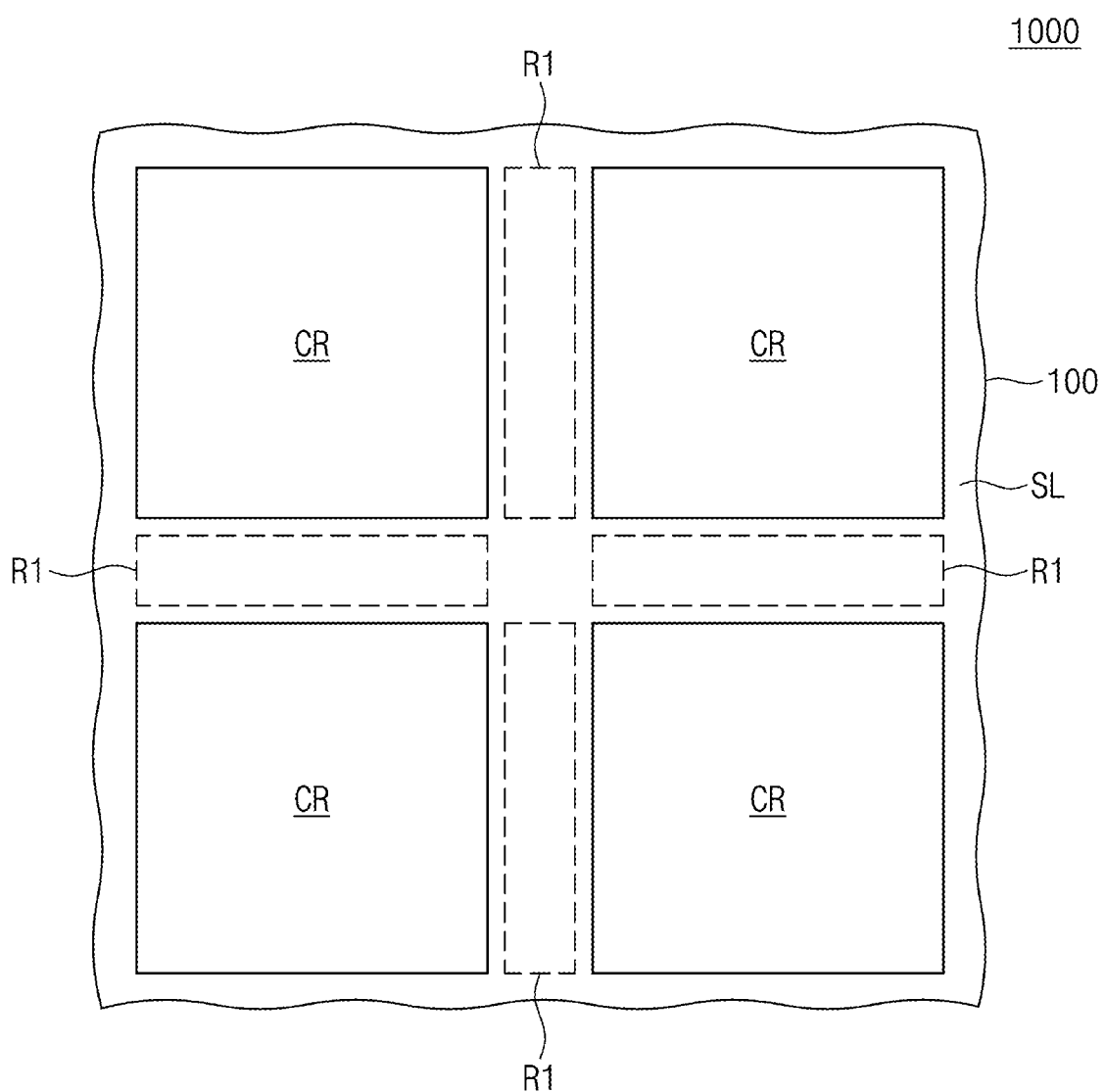
FIG. 1 illustrates a simplified plan view showing a three-dimensional semiconductor memory device according to some embodiments of inventive concepts.

FIG. 1 illustrates a simplified plan view showing a three-dimensional semiconductor memory device according to some embodiments of inventive concepts.

Referring to FIG. 1, a three-dimensional semiconductor memory device 1000 may include a substrate 100, and the substrate 100 may include a plurality of chip regions CR and a scribe line SL between the plurality of chip regions CR. The substrate 100 may be a semiconductor substrate, for example, a silicon substrate or a silicon-on-insulator (SOI) substrate. The three-dimensional semiconductor memory device 1000 may be configured such that memory cells and peripheral circuits are disposed on each of the plurality of chip regions CR. The peripheral circuits may be integrated circuits for driving the memory cells. The scribe line SL may include a key region R1 on which are disposed alignment keys or overlay keys used in photolithography processes for forming the memory cells and the peripheral circuits.

Figure 2:
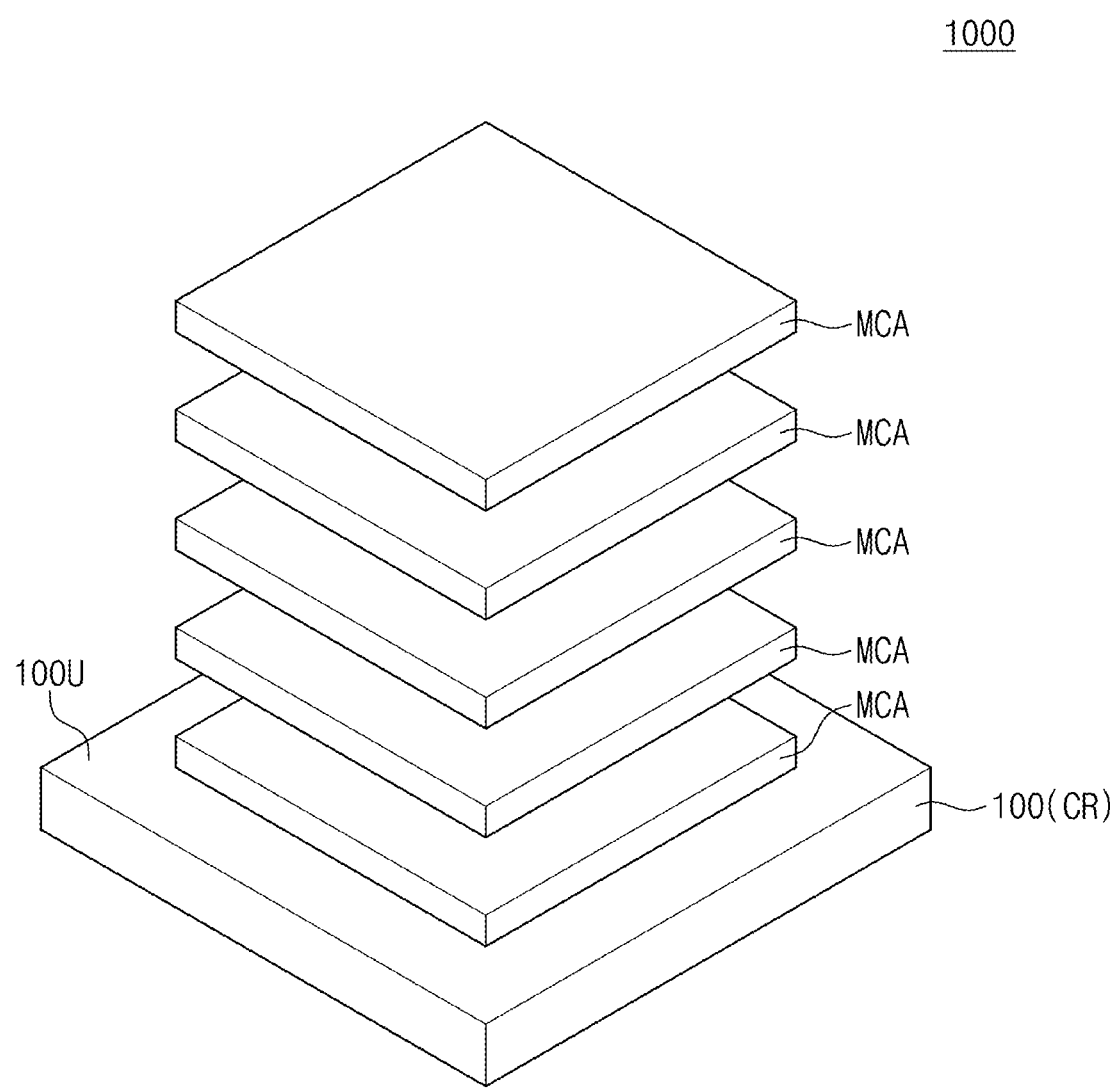
FIG. 2 illustrates a conceptual view showing a three-dimensional semiconductor memory device according to some embodiments of inventive concepts.
Figure 3:
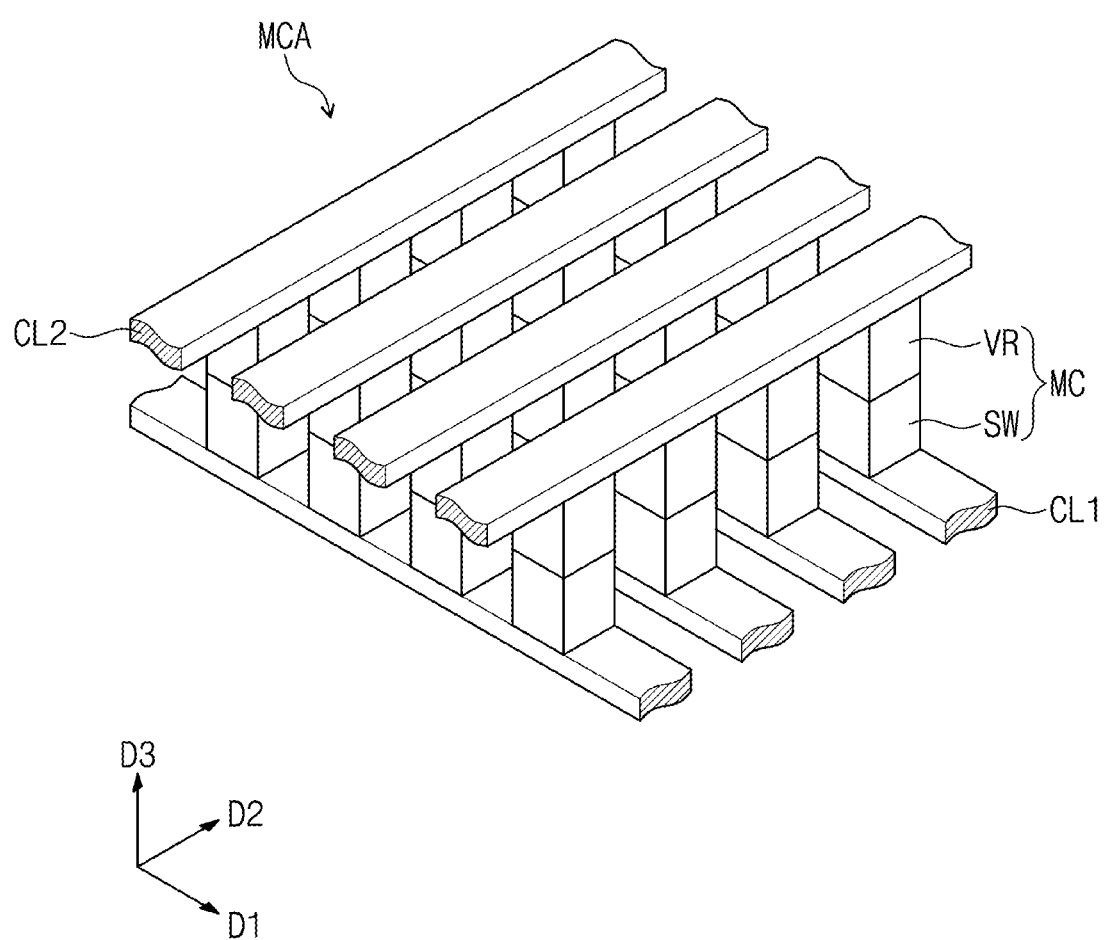
FIG. 3 illustrates a simplified perspective view showing a memory cell array of FIG. 2.

FIG. 2 illustrates a conceptual view showing a three-dimensional semiconductor memory device according to some embodiments of inventive concepts. FIG. 3 illustrates a simplified perspective view showing a memory cell array of FIG. 2.

Referring to FIGS. 2 and 3, the three-dimensional semiconductor memory device 1000 may include a plurality of memory cell arrays MCA that are vertically stacked on each of the plurality of chip regions CR of the substrate 100. According to some embodiments, peripheral circuits for driving the plurality of memory cell arrays MCA may be disposed between the substrate 100 and a lowermost one of the plurality of memory cell arrays MCA. According to some embodiments, the peripheral circuits may be disposed on each of the plurality of chip regions CR of the substrate 100, and may be placed on at least one side of the plurality of memory cell arrays MCA. FIG. 2 shows five memory cell stacks MCA, but inventive concepts are not limited thereto.

Each of the plurality of memory cell arrays MCA may include first conductive lines CL1, second conductive lines CL2 that run across the first conductive lines CL1, and memory cells MC between the first conductive lines CL1 and the second conductive lines CL2. The first conductive lines CL1 may extend in a first direction D1 and may be spaced apart from each other in a second direction D2 that intersects the first direction D1. The second conductive lines CL2 may be spaced apart from the first conductive lines CL1 along a third direction D3 perpendicular to the first and second directions D1 and D2. The second conductive lines CL2 may extend in the second direction D2 and may be spaced apart from each other in the first direction D1. The first and second directions D1 and D2 may be parallel to a top surface 100U of the substrate 100 depicted in FIG. 1, and the third direction D3 may be perpendicular to the top surface 100U of the substrate 100. The first and second conductive lines CL1 and CL2 may include one or more of metal (e.g., copper, tungsten, or aluminum) and metal nitride (e.g., tantalum nitride, titanium nitride, or tungsten nitride).

The memory cells MC may be disposed at corresponding intersections between the first conductive lines CL1 and the second conductive lines CL2. The memory cells MC may be two-dimensionally arranged along the first and second directions D1 and D2. Each of the memory cells MC may include a variable resistance pattern VR and a switching pattern SW. The variable resistance pattern VR and the switching pattern SW may be stacked in the third direction D3 between a pair of first and second conductive lines CL1 and CL2 that are connected thereto. The variable resistance pattern VR and the switching pattern SW may be connected to each other in series. For example, the variable resistance pattern VR and the switching pattern SW included in each of the memory cells MC may be connected to each other in series between their corresponding first conductive line CL1 and their corresponding second conductive line CL2. FIG. 3 shows that the switching pattern SW is disposed below the variable resistance pattern VR, but inventive concepts are not limited thereto. For example, different from the example shown in FIG. 3, the variable resistance pattern VR may be disposed below the switching pattern SW.

The variable resistance pattern VR may include a material that stores data based on a variation in resistance. In some embodiments, the variable resistance pattern VR may include a material of which phase can be reversibly changed between a crystalline state and an amorphous state depending on a temperature of the material. The variable resistance pattern VR may include a compound in which at least one selected from Te and Se (chalcogen elements) is combined with at least one selected from Ge, Sb, Bi, Pb, Sn, Ag, As, S, Si, In, Ti, and Ga.

For example, the variable resistance pattern VR may include at least one selected from GeTe, GeSe, GeS, SbSe, SbTe, SbS, SbSe, SnSb, InSe, InSb, AsTe, AlTe, GaSb, AlSb, BiSb, ScSb, Ysb, CeSb, DySb, and NdSb. For example, the variable resistance pattern VR may include at least one selected from GeSbSe, AlSbTe, AlSbSe, SiSbSe, SiSbTe, GeSeTe, InGeTe, GeSbTe, GeAsTe, SnSeTe, GeGaSe, BiSbSe, GaSeTe, InGeSb, GaSbSe, GaSbTe, InSbSe, InSbTe, SnSbSe, SnSbTe, ScSbTe, ScSbSe, ScSbS, YSbTe, YSbSe, YSbS, CeSbTe, CeSbSe, CeSbS, DySbTe, DySbSe, DySbS, NdSbTe, NdSbSe, and NdSbS. For example, the variable resistance pattern VR may include at least one selected from GeSbTeS, BiSbTeSe, AgInSbTe, GeSbSeTe, GeSnSbTe, SiGeSbTe, SiGeSbSe, SiGeSeTe, BiGeSeTe, BiSiGeSe, BiSiGeTe, GeSbTeBi, GeSbSeBi, GeSbSeIn, GeSbSeGa, GeSbSeAl, GeSbSeTl, GeSbSeSn, GeSbSeZn, GeSbTeIn, GeSbTeGa, GeSbTeAl, GeSbTeTl, GeSbTeSn, GeSbTeZn, ScGeSbTe, ScGeSbSe, ScGeSbS, YGeSbTe, YGeSbSe, YGeSbS, CeGeSbTe, CeGeSbSe, CeGeSbS, DyGeSbTe, DyGeSbSe, DyGeSbS, NdGeSbTe, NdGeSbSe, and NdGeSbS. For example, the variable resistance pattern VR may include at least one selected from InSbTeAsSe, GeScSbSeTe, GeSbSeTeS, GeScSbSeS, GeScSbTeS, GeScSeTeS, GeScSbSeP, GeScSbTeP, GeSbSeTeP, GeScSbSeIn, GeScSbSeGa, GeScSbSeAl, GeScSbSeTl, GeScSbSeZn, GeScSbSeSn, GeScSbTeIn, GeScSbTeGa, GeSbAsTeAl, GeScSbTeTl, GeScSbTeZn, GeScSbTeSn, GeSbSeTeIn, GeSbSeTeGa, GeSbSeTeAl, GeSbSeTeTl, GeSbSeTeZn, GeSbSeTeSn, GeSbSeSIn, GeSbSeSGa, GeSbSeSAl, GeSbSeSTl, GeSbSeSZn, GeSbSeSSn, GeSbTeSIn, GeSbTeSGa, GeSbTeSAl, GeSbTeSTl, GeSbTeSZn, GeSbTeSSn, GeSbSeInGa, GeSbSeInAl, GeSbSeInTl, GeSbSeInZn, GeSbSeInSn, GeSbSeGaAl, GeSbSeGaTl, GeSbSeGaZn, GeSbSeGaSn, GeSbSeAlTl, GeSbSeAlZn, GeSbSeAlSn, GeSbSeTlZn, GeSbSeTlSn, and GeSbSeZnSn. The variable resistance pattern VR may further include at least one selected from C, N, O, P, Cd, W, Ti, Hf, and Zr.

For another example, the variable resistance pattern VR may have a single-layered structure or a multi-layered structure in which a plurality of layers are stacked. In some embodiments, the variable resistance pattern VR may have a super-lattice structure in which a Ge-containing layer and a Ge-free layer are repeatedly stacked. For example, the variable resistance pattern VR may have a structure in which a GeTe layer and a SbTe layer are repeatedly stacked.

According to some embodiments, the variable resistance pattern VR may include at least one selected from perovskite compounds and conductive metal oxides. For example, the variable resistance pattern VR may include at least one selected from niobium oxide, titanium oxide, nickel oxide, zirconium oxide, vanadium oxide, PCMO((Pr,Ca)MnO$_3$), strontium-titanium oxide, barium-strontium-titanium oxide, strontium-zirconium oxide, barium-zirconium oxide, and barium-strontium-zirconium oxide. When the variable resistance pattern VR includes transition metal oxide, the variable resistance pattern VR may have a dielectric constant greater than that of a silicon oxide layer.

According to some embodiments, the variable resistance pattern VR may be a double structure that includes a conductive metal oxide layer and a tunnel dielectric layer or a triple structure that includes a first conductive metal oxide layer, a tunnel dielectric layer, and a second conductive metal oxide layer. In this case, the tunnel dielectric layer may include aluminum oxide, hafnium oxide, or silicon oxide.

The switching pattern SW may include a diode, such as a silicon diode or an oxide diode, which exhibits rectifying characteristics. In this case, the switching pattern SW may include either a silicon diode in which p-type Si and n-type Si are joined together or an oxide diode in which p-type NiOx and n-type TiOx, or p-type CuOx and n-type TiOx, are joined together. For another example, the switching pattern SW may include an oxide material, for example, ZnOx, MgOx, and AlOx, having high resistance that limits and/or prevents electric current flow at a specific voltage or having less and low resistance that allows electric current flow at the specific voltage or higher.

For another example, the switching pattern SW may be an OTS (Ovonic Threshold Switch) device that has bidirectional characteristics. In this case, the switching pattern SW may include a chalcogenide material in a substantially amorphous state. In this description, the substantially amorphous state may not exclude the presence of a locally crystalline grain boundary or a locally crystalline portion. In this case, the chalcogenide material may include a compound in which at least one selected from Te and Se (chalcogen elements) is combined with at least one selected from Ge, Sb, Bi, Al, Pb, Sn, Ag, As, S, Si, In, Ti, Ga, and P.

For example, the switching pattern SW may include at least one selected from GeSe, GeS, AsSe, AsTe, AsS, SiTe, SiSe, SiS, GeAs, SiAs, SnSe, and SnTe. For example, the switching pattern SW may include at least one selected from GeAsTe, GeAsSe, AlAsTe, AlAsSe, SiAsSe, SiAsTe, GeSeTe, GeSeSb, GaAsSe, GaAsTe, InAsTe, InAsTe, SnAsSe, and SnAsTe. For example, the switching pattern SW may include at least one selected from GeSiAsTe, GeSiAsSe, GeSiSeTe, GeSeTeSb, GeSiSeSb, GeSiTeSb, GeSeTeBi, GeSiSeBi, GeSiTeBi, GeAsSeSb, GeAsTeSb, GeAsTeBi, GeAsSeBi, GeAsSeIn, GeAsSeGa, GeAsSeAl, GeAsSeTl, GeAsSeSn, GeAsSeZn, GeAsTeIn, GeAsTeGa, GeAsTeAl, GeAsTeTl, GeAsTeSn, and GeAsTeZn. For example, the switching pattern SW may include at least one selected from GeSiAsSeTe, GeAsSeTeS, GeSiAsSeS, GeSiAsTeS, GeSiSeTeS, GeSiAsSeP, GeSiAsTeP, GeAsSeTeP, GeSiAsSeIn, GeSiAsSeGa, GeSiAsSeAl, GeSiAsSeTl, GeSiAsSeZn, GeSiAsSeSn, GeSiAsTeIn, GeSiAsTeGa, GeSiAsTeAl, GeSiAsTeTl, GeSiAsTeZn, GeSiAsTeSn, GeAsSeTeIn, GeAsSeTeGa, GeAsSeTeAl, GeAsSeTeTl, GeAsSeTeZn, GeAsSeTeSn, GeAsSeSIn, GeAsSeSGa, GeAsSeSAl, GeAsSeSTl, GeAsSeSZn, GeAsSeSSn, GeAsTeSIn, GeAsTeSGa, GeAsTeSAl, GeAsTeSTl, GeAsTeSZn, GeAsTeSSn, GeAsSeInGa, GeAsSeInAl, GeAsSeInTl, GeAsSeInZn, GeAsSeInSn, GeAsSeGaAl, GeAsSeGaTl, GeAsSeGaZn, GeAsSeGaSn, GeAsSeAlTl, GeAsSeAlZn, GeAsSEAlSn, GeAsSeTlZn, GeAsSeTlSn, and GeAsSeZnSn. The switching pattern SW may further include at least one selected from B, C, N, and O. The switching pattern SW may have a single-layered structure or a multi-layered structure in which a plurality of layers are stacked.

FIGS. 4, 7, 10, 13, 16, 19, 22, 25, 28, 31, 34, and 37 illustrate plan views showing a method of fabricating a three-dimensional semiconductor memory device according to some embodiments of inventive concepts. FIGS. 5, 8, 11, 14, 17, 20, 23, 26, 29, 32, 35, and 38 illustrate cross-sectional views taken along lines I-I' and II-IF of FIGS. 4, 7, 10, 13, 16, 19, 22, 25, 28, 31, 34, and 37, respectively. FIGS. 6, 9, 12, 15, 18, 21, 24, 27, 30, 33, 36, and 39 illustrate cross-sectional views taken along lines III-III' and IV-IV' of FIGS. 4, 7, 10, 13, 16, 19, 22, 25, 28, 31, 34, and 37, respectively.

Figure 4:
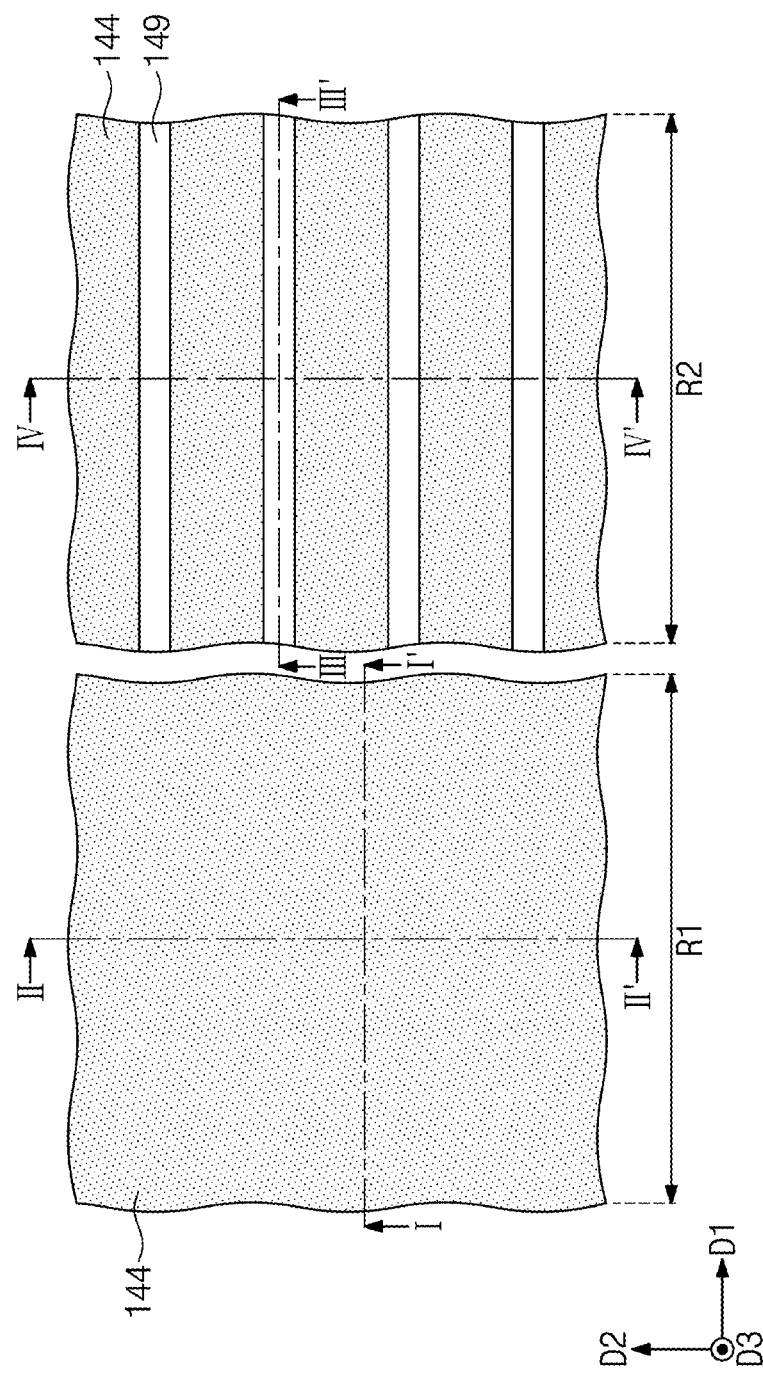
FIGS. 4, 7, 10, 13, 16, 19, 22, 25, 28, 31, 34, and 37 illustrate plan views showing a method of fabricating a three-dimensional semiconductor memory device according to some embodiments of inventive concepts.
Figure 5:
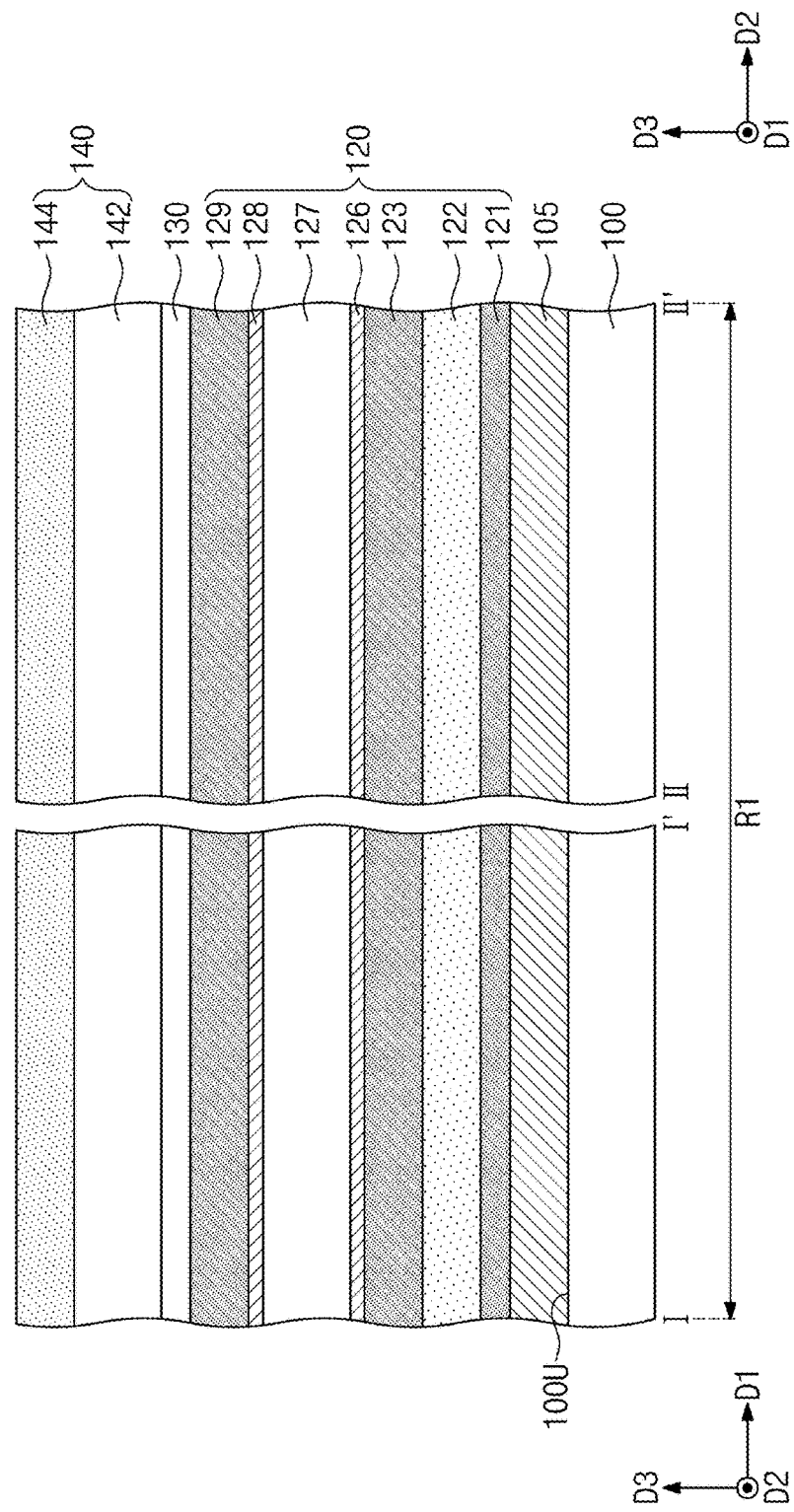
FIGS. 5, 8, 11, 14, 17, 20, 23, 26, 29, 32, 35, and 38 illustrate cross-sectional views taken along lines I-I' and II-IF of FIGS. 4, 7, 10, 13, 16, 19, 22, 25, 28, 31, 34, and 37, respectively.
Figure 6:
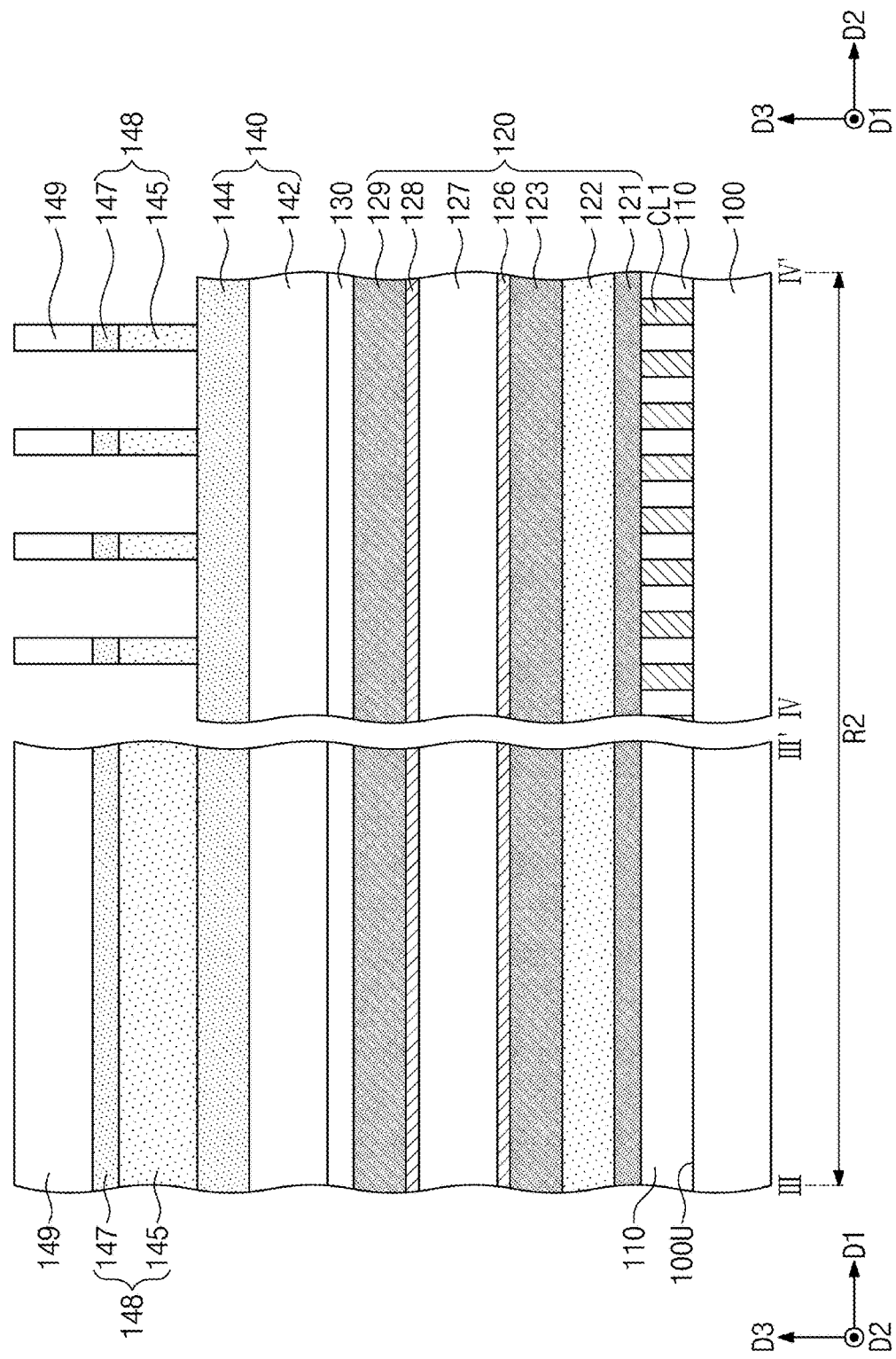
FIGS. 6, 9, 12, 15, 18, 21, 24, 27, 30, 33, 36, and 39 illustrate cross-sectional views taken along lines III-III' and IV-IV' of FIGS. 4, 7, 10, 13, 16, 19, 22, 25, 28, 31, 34, and 37, respectively.

Referring to FIGS. 4 to 6, a substrate 100 may be provided which includes a key region R1 and a cell region R2. The key region R1 may be a region of the scribe line SL of FIG. 1, on which alignment keys or overlay keys used for photolithography are disposed. The cell region R2 may be a region of the chip region of FIG. 1, on which the memory cell arrays MCA discussed with reference to FIGS. 2 and 3 are disposed.

First conductive lines CL1 may be formed on the cell region R2 of the substrate 100, and a conductive pattern 105 may be formed on the key region R1 of the substrate 100. The first conductive lines CL1 may extend in a first direction D1 parallel to a top surface 100U of the substrate 100, and may be spaced apart from each other in a second direction D2 parallel to the top surface 100U of the substrate 100 while intersecting the first direction D1. The conductive pattern 105 may have, for example, a plate shape that extends in the first direction D1 and the second direction D2. The formation of the first conductive lines CL1 and the conductive pattern 105 may include, for example, forming on the substrate 100 a conductive layer to cover the key region R1 and the cell region R2, and patterning the conductive layer. The first conductive lines CL1 and the conductive pattern 105 may include at least one selected from doped semiconductor materials (e.g., doped silicon), metal (e.g., tungsten, aluminum, titanium, and/or tantalum), conductive metal nitride (e.g., titanium nitride, tantalum nitride, and/or tungsten nitride), and metal-semiconductor compounds (e.g., metal silicide).

After the formation of the first conductive lines CL1 and the conductive pattern 105, a lower dielectric layer 110 may be formed on the substrate 100. The lower dielectric layer 110 may cover lateral surfaces of the first conductive lines CL1 and may expose top surfaces of the first conductive lines CL1. The lower dielectric layer 110 may cover a sidewall of the conductive pattern 105 and may expose a top surface of the conductive pattern 105. The formation of the lower dielectric layer 110 may include, for example, depositing on the substrate 100 the lower dielectric layer 110 to cover the first conductive lines CL1 and the conductive pattern 105, and planarizing the lower dielectric layer 110 to expose the top surfaces of the first conductive lines CL1 and the top surface of the conductive pattern 105. The lower dielectric layer 110 may include, for example, one or more of silicon oxide, silicon nitride, and silicon oxynitride.

A cell stack layer 120 may be formed on the substrate 100, covering the key region R1 and the cell region R2. The cell stack layer 120 may cover the top surfaces of the first conductive lines CL1, the top surface of the conductive pattern 105, and a top surface of the lower dielectric layer 110. The cell stack layer 120 may include a first electrode layer 121, a switching layer 122, a second electrode layer 123, a variable resistance layer 127, and a third electrode layer 129 that are sequentially stacked along a third direction D3 perpendicular to the top surface 100U of the substrate 100. The cell stack layer 120 may further include a first metal layer 126 between the second electrode layer 123 and the variable resistance layer 127 and a second metal layer 128 between the third electrode layer 129 and the variable resistance layer 127. The cell stack layer 120 may be formed by using one or more of chemical vapor deposition, physical vapor deposition, and the like.

A protection layer 130 may be formed on the cell stack layer 120 of the key and cell regions R1 and R2. The protection layer 130 may include, for example, a silicon nitride layer.

A first mask layer 140 may be formed on the protection layer 130 of the key and cell regions R1 and R2. The first mask layer 140 may include a first lower mask layer 142 and a first upper mask layer 144 that are sequentially stacked on the protection layer 130. The first lower mask layer 142 and the first upper mask layer 144 may have their thicknesses in the third direction D3, and the thickness of the first lower mask layer 142 may be greater than the thickness of the first upper mask layer 144. For example, the first lower mask layer 142 may include silicon oxide, and the first upper mask layer 144 may include polycrystalline silicon.

First sacrificial patterns 148 may be formed on the first mask layer 140 of the cell region R2. The first sacrificial patterns 148 may be elongated in the first direction D1 and may be spaced apart from each other along the second direction D2. Each of the first sacrificial patterns 148 may include a first lower sacrificial pattern 145 and a first upper sacrificial pattern 147 that are sequentially stacked on the first mask layer 140. For example, the first lower sacrificial pattern 145 may include a spin-on-hardmask (SOH) material, and the first upper sacrificial pattern 147 may include silicon oxynitride. The formation of the first sacrificial patterns 148 may include, for example, depositing a first sacrificial layer on the first mask layer 140 of the key and cell regions R1 and R2, forming first photoresist patterns 149 on the first sacrificial layer of the cell region R2, and using the first photoresist patterns 149 as an etching mask to etch the first sacrificial layer. The first sacrificial layer may include a first lower sacrificial layer and a first upper sacrificial layer that are sequentially stacked on the first mask layer 140. The etching of the first sacrificial layer may include sequentially etching the first upper sacrificial layer and the first lower sacrificial layer, and therefore, the first upper sacrificial pattern 147 and the first lower sacrificial pattern 145 may be formed. As the first photoresist patterns 149 on the cell region R2 are used as an etching mask to etch the first sacrificial layer, it may be possible to expose a top surface of the first mask layer 140 (or a top surface of the first upper mask layer 144) on the key region R1.

Figure 7:
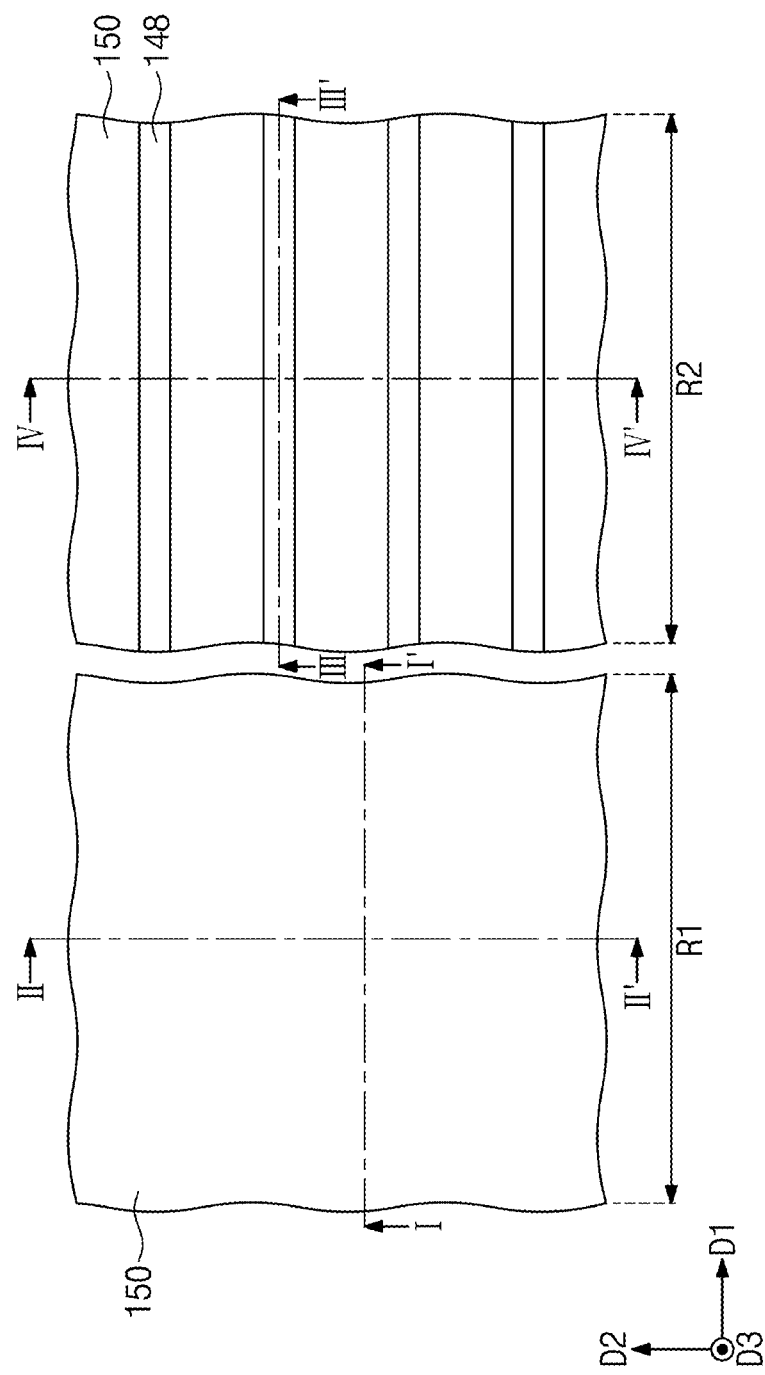
Figure 8:
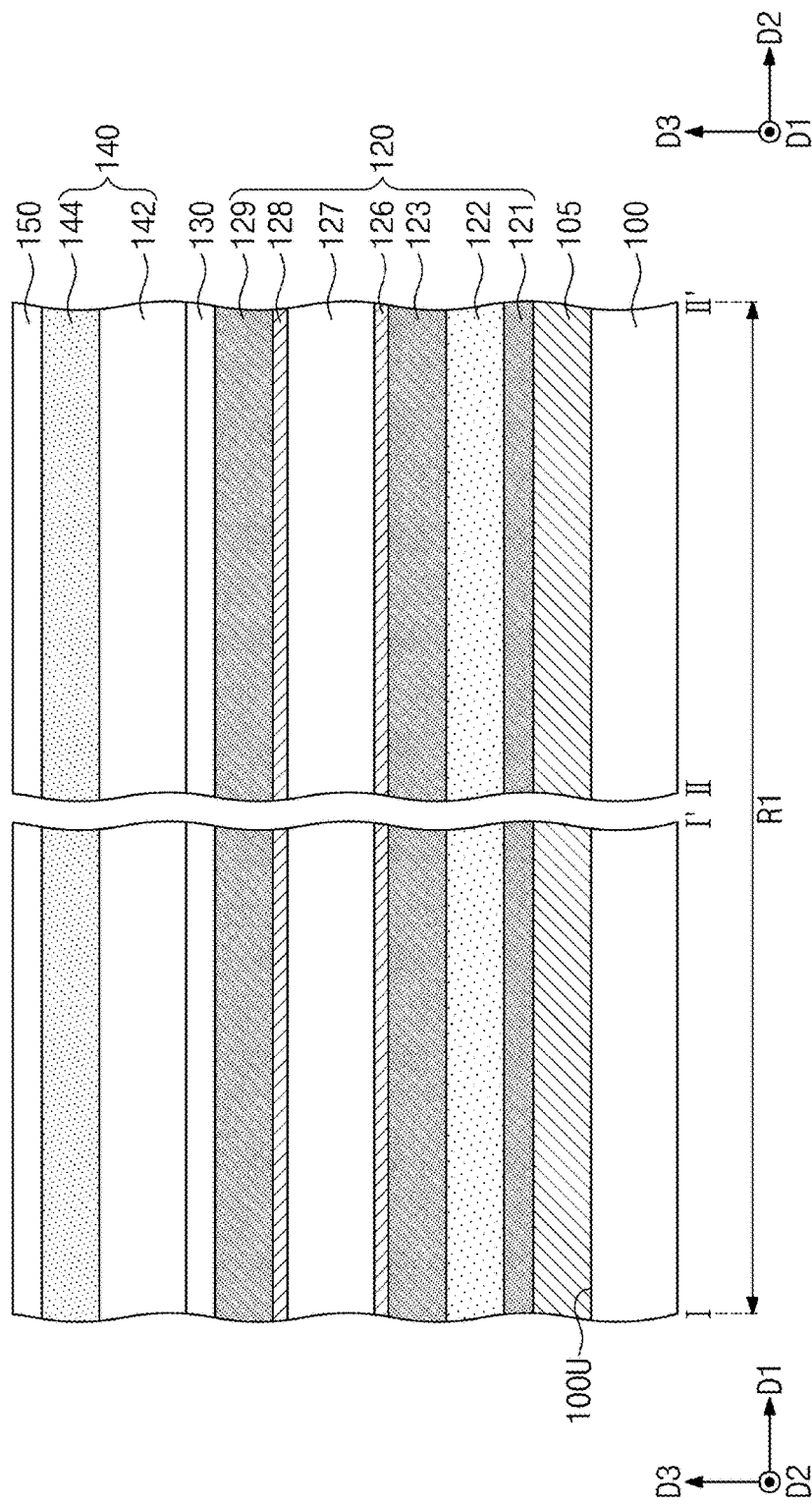
Figure 9:
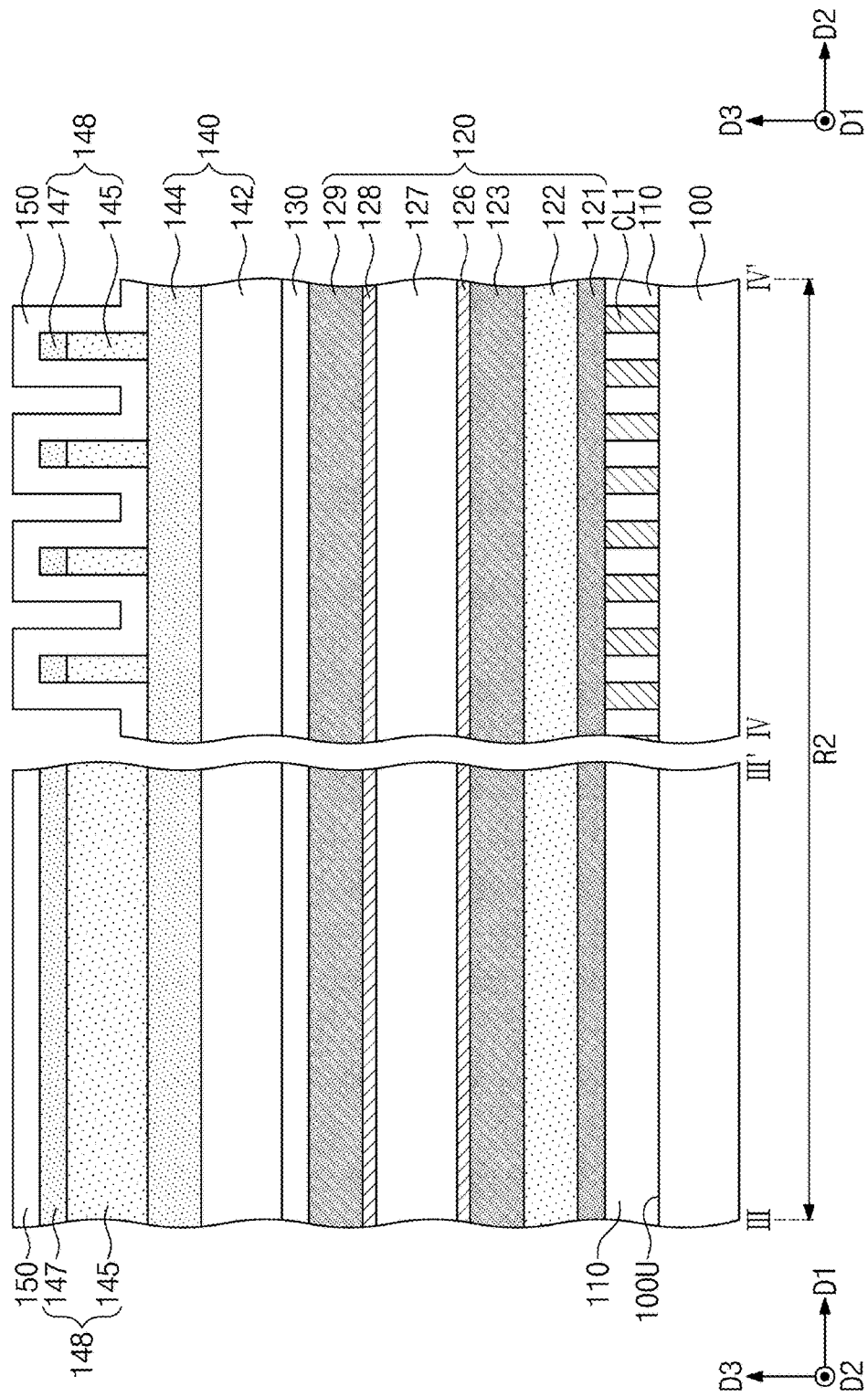

Referring to FIGS. 7 to 9, after the first sacrificial patterns 148 are formed, the first photoresist patterns 149 may be removed. The first photoresist patterns 149 may be removed by, for example, one or both of an ashing process and a strip process.

A first spacer layer 150 may be formed on the first mask layer 140 of the key and cell regions R1 and R2, thereby covering the first sacrificial patterns 148. The first spacer layer 150 may conformally cover top and lateral surfaces of the first sacrificial patterns 148 and to cover the top surface of the first mask layer 140 between the first sacrificial patterns 148. The first spacer layer 150 may extend along the top surface of the first mask layer 140 on the key region R1. For example, the first spacer layer 150 may be formed by an atomic layer deposition process and may include silicon oxide.

Figure 10:
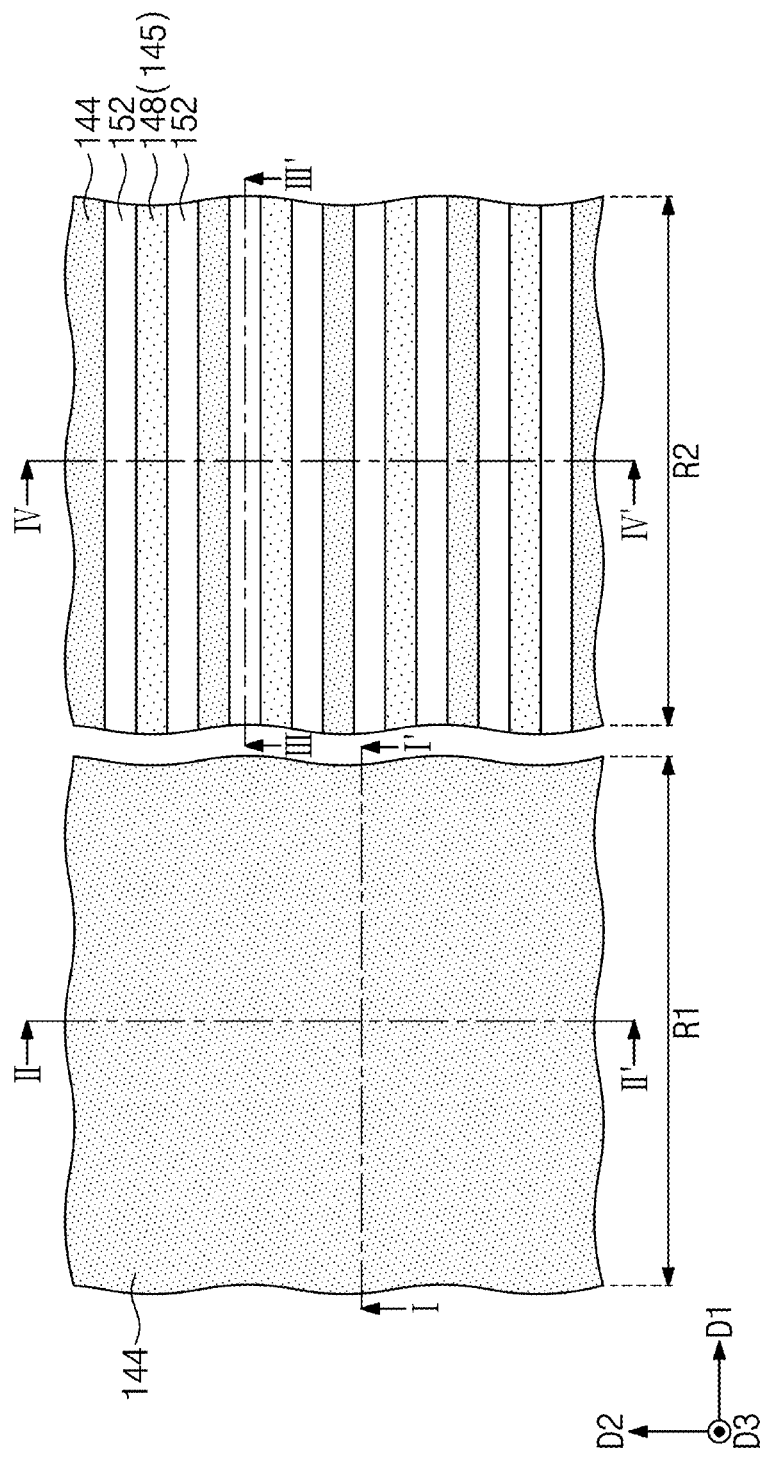
Figure 11:
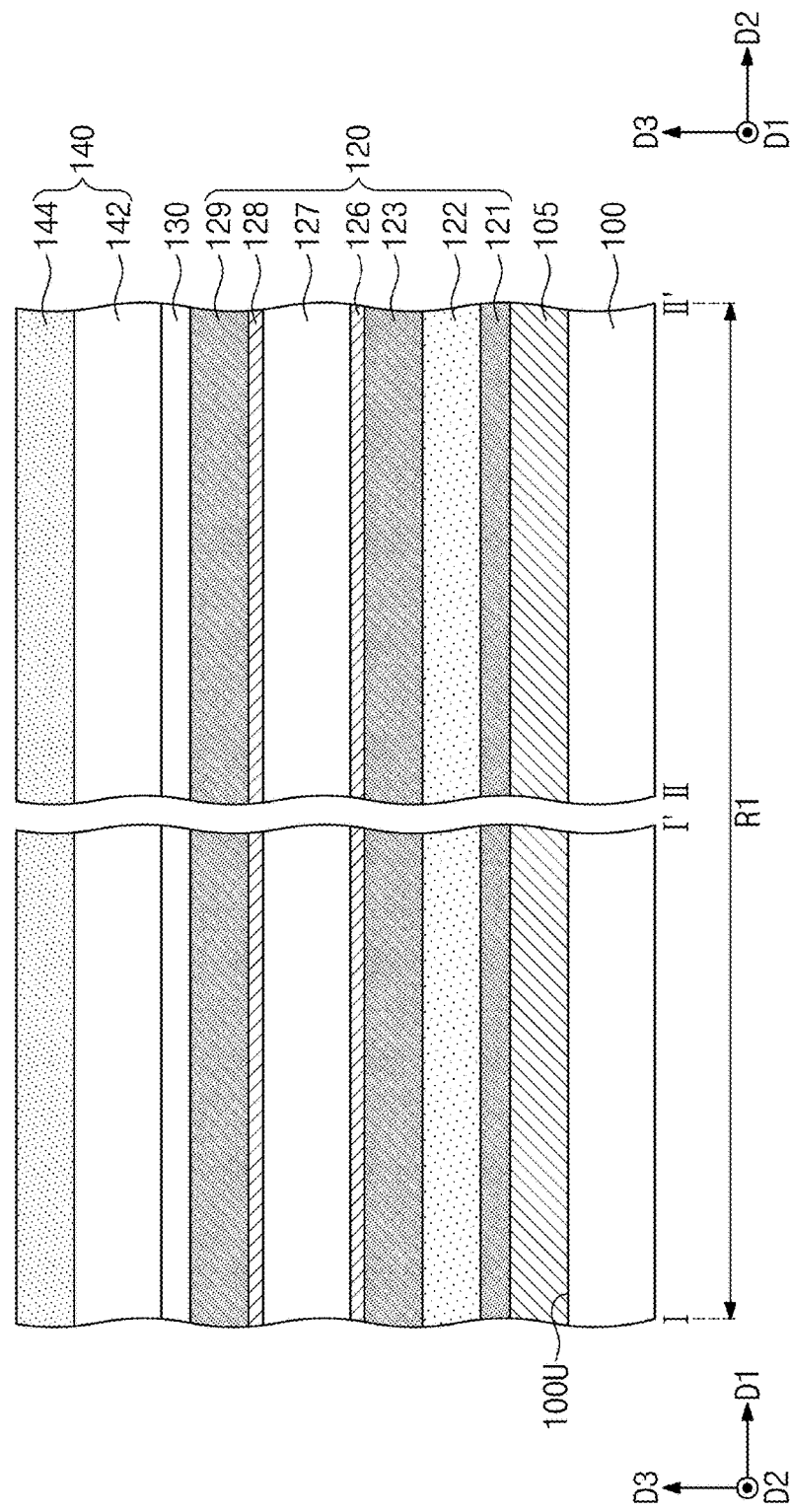
Figure 12:
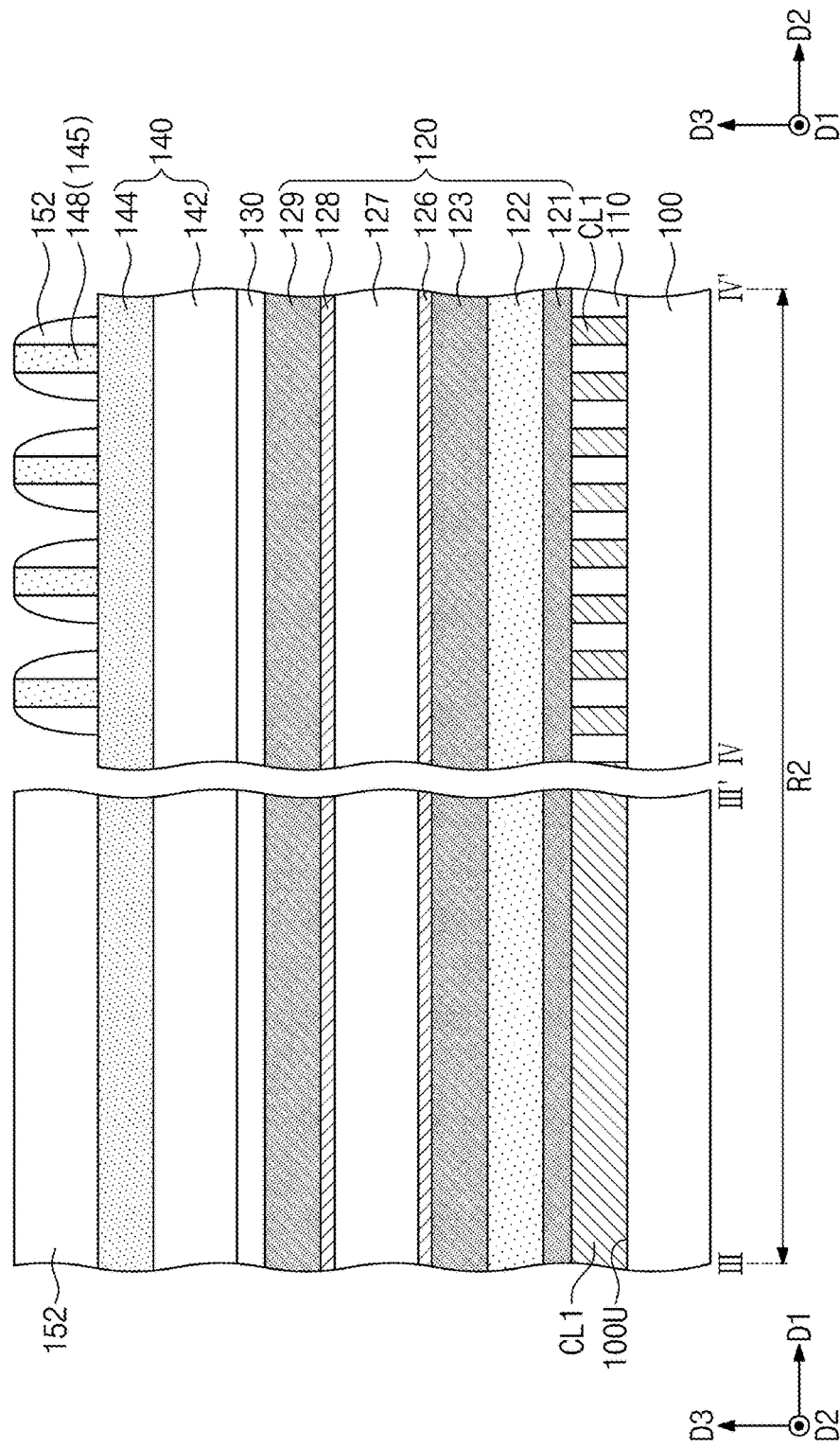

Referring to FIGS. 10 to 12, first spacer patterns 152 may be formed on opposite lateral surfaces of each of the first sacrificial patterns 148. The first spacer patterns 152 may be formed by anisotropically etching the first spacer layer 150. While the first spacer layer 150 is anisotropically etched, the first upper sacrificial pattern 147 of each of the first sacrificial patterns 148 may be removed, and thus the first spacer patterns 152 may be formed on opposite lateral surfaces of the first lower sacrificial pattern 145 of each of the first sacrificial patterns 148. The first spacer patterns 152 may be elongated in the first direction D1 and may be spaced apart from each other along the second direction D2. The anisotropic etching of the first spacer layer 150 may expose the top surface (or the top surface of the first upper mask layer 144) of the first mask layer 140.

Figure 13:
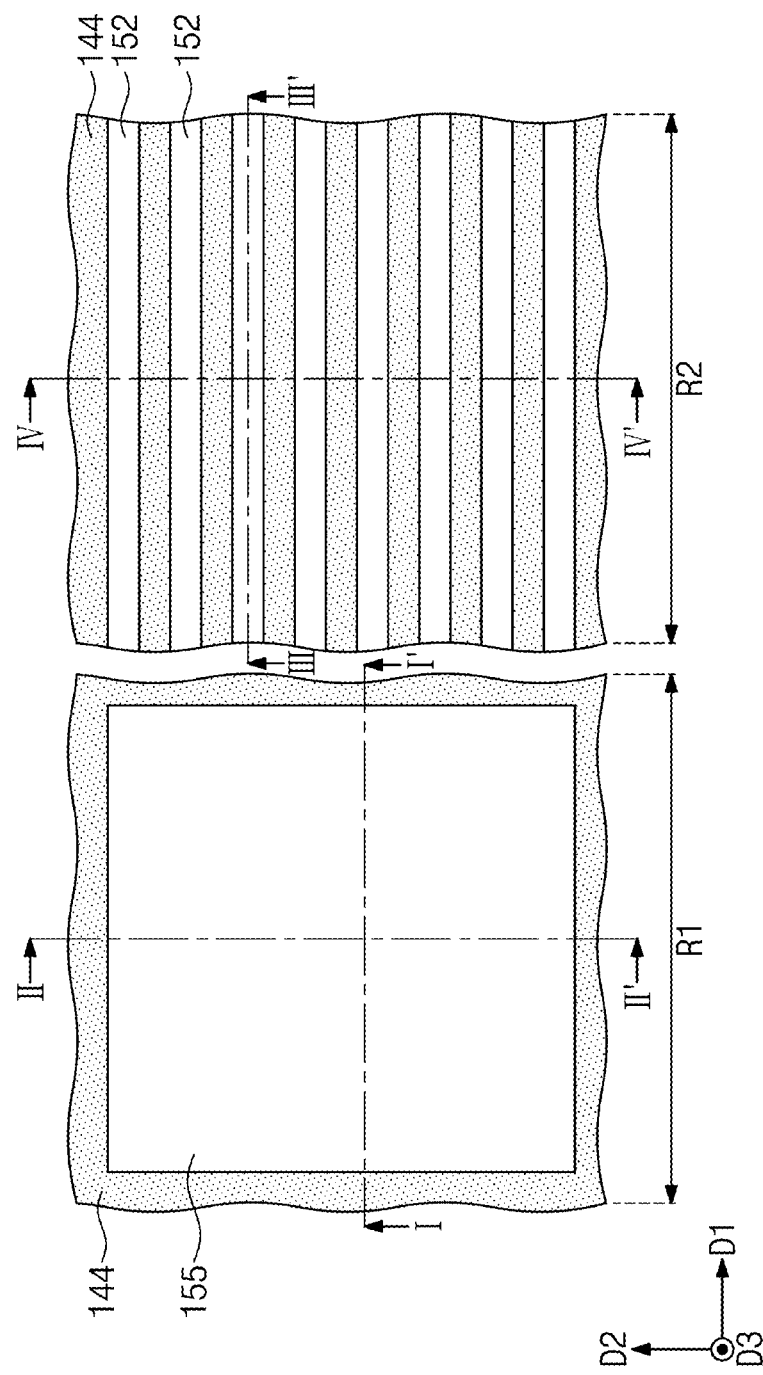
Figure 14:
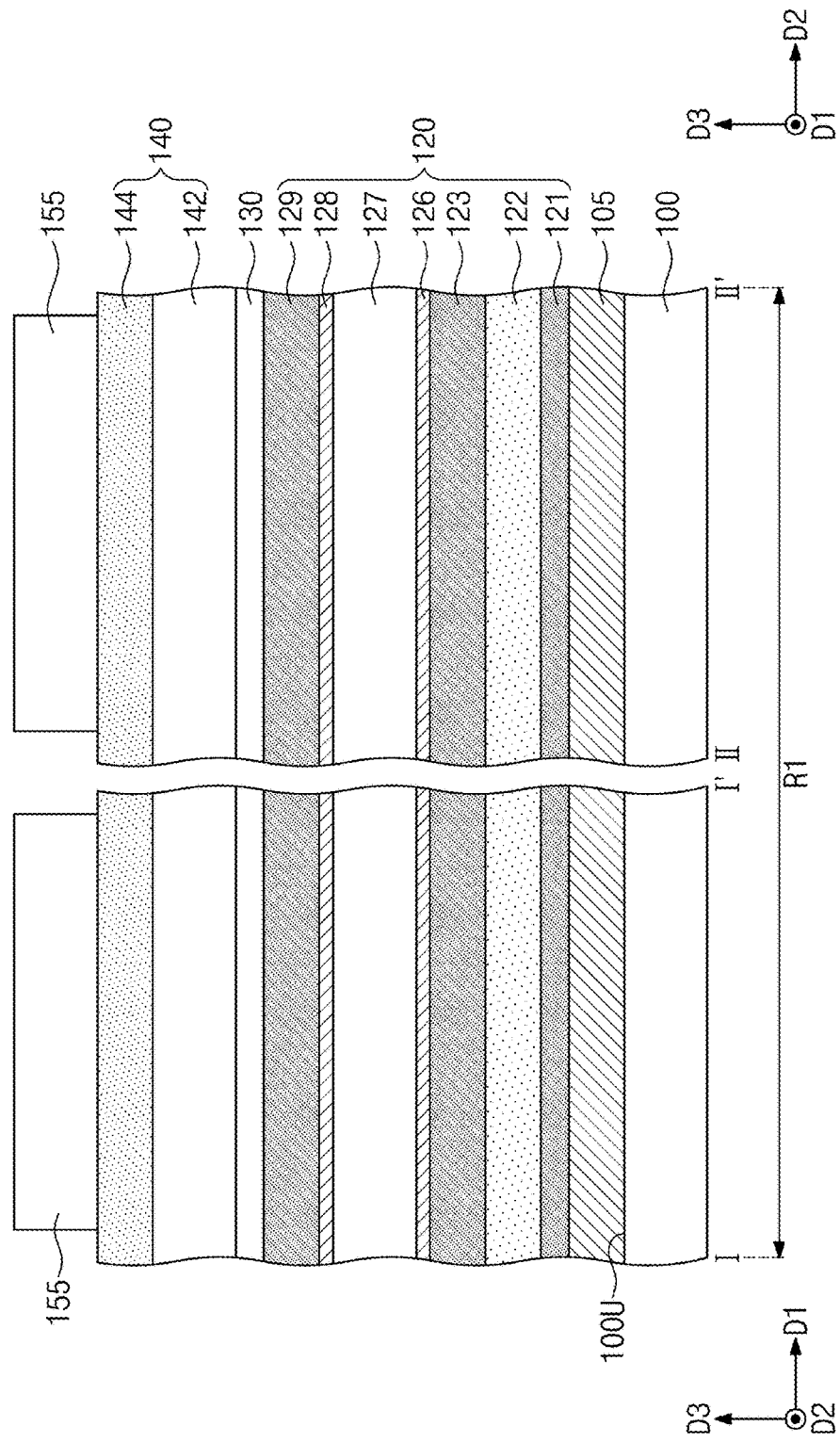
Figure 15:
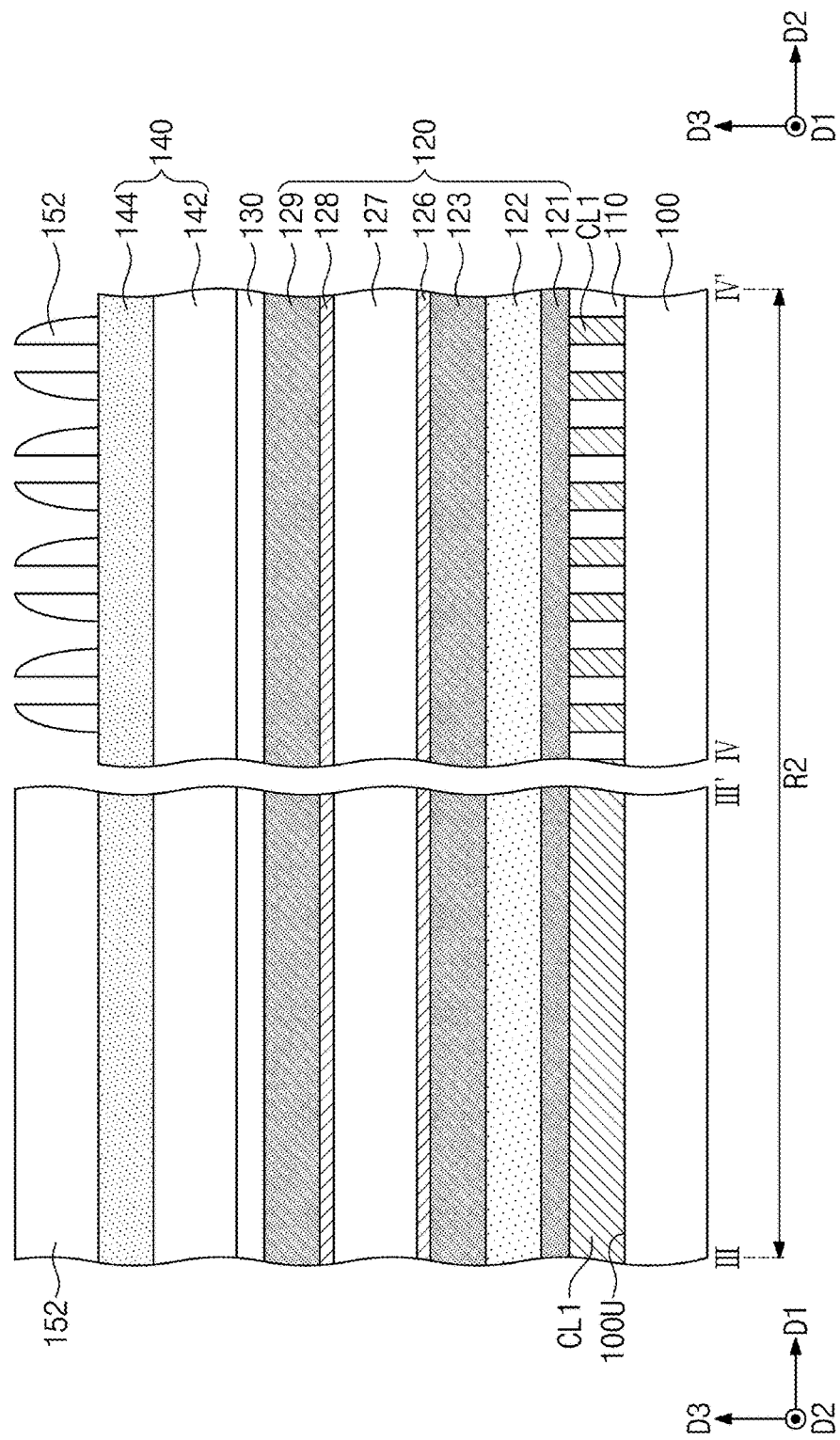

Referring to FIGS. 13 to 15, after the first spacer patterns 152 are formed, a removal action may be performed on the first lower sacrificial pattern 145 of each of the first sacrificial patterns 148. The first lower sacrificial pattern 145 may be removed by, for example, one or both of an ashing process and a strip process.

A first blocking pattern 155 may be formed on the first mask layer 140 of the key region R1. The first blocking pattern 155 may define on the key region R1 a position of a key mask pattern which will be discussed below, and may have a plate shape that extends in the first direction D1 and the second direction D2. The first blocking pattern 155 may be formed by performing a photolithography process after the formation of the first spacer patterns 152. The first blocking pattern 155 may be a photoresist pattern formed by the photolithography process.

Figure 16:
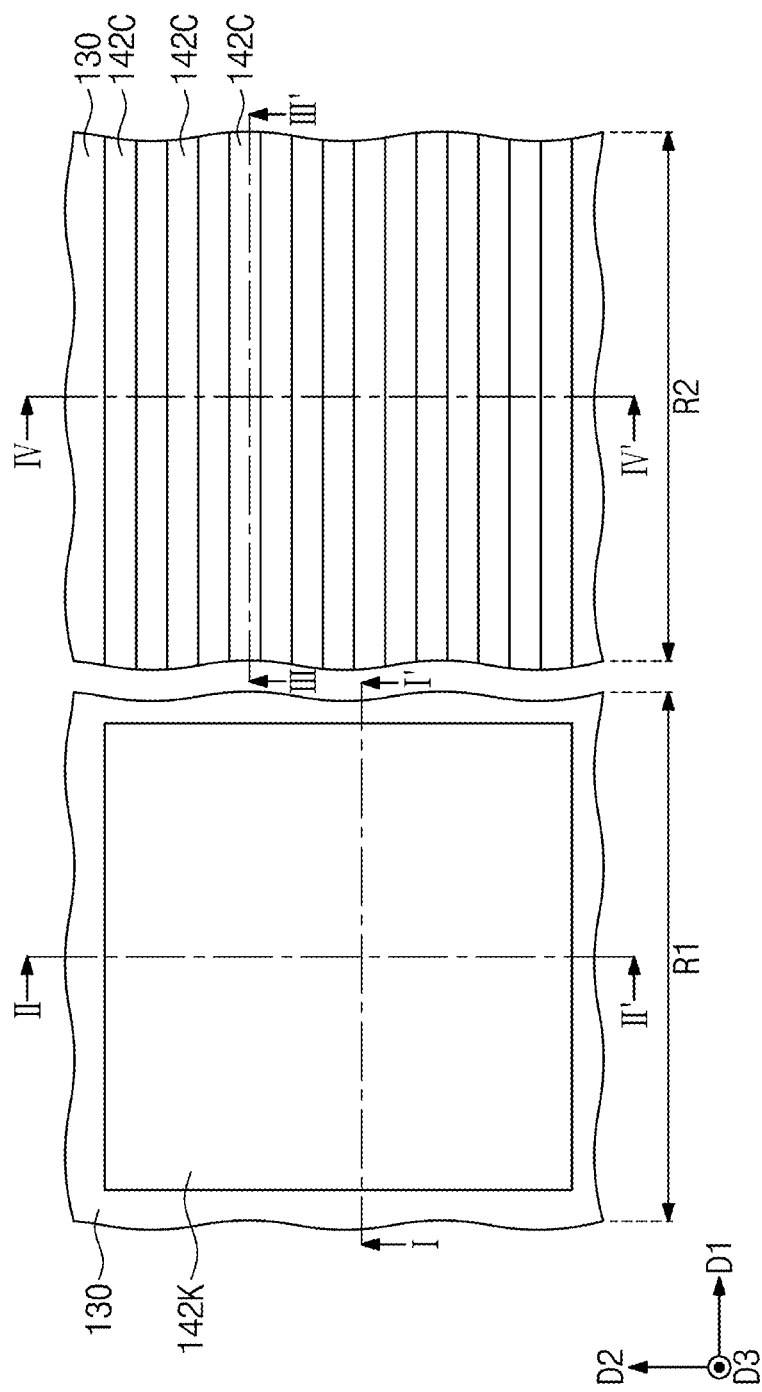
Figure 17:
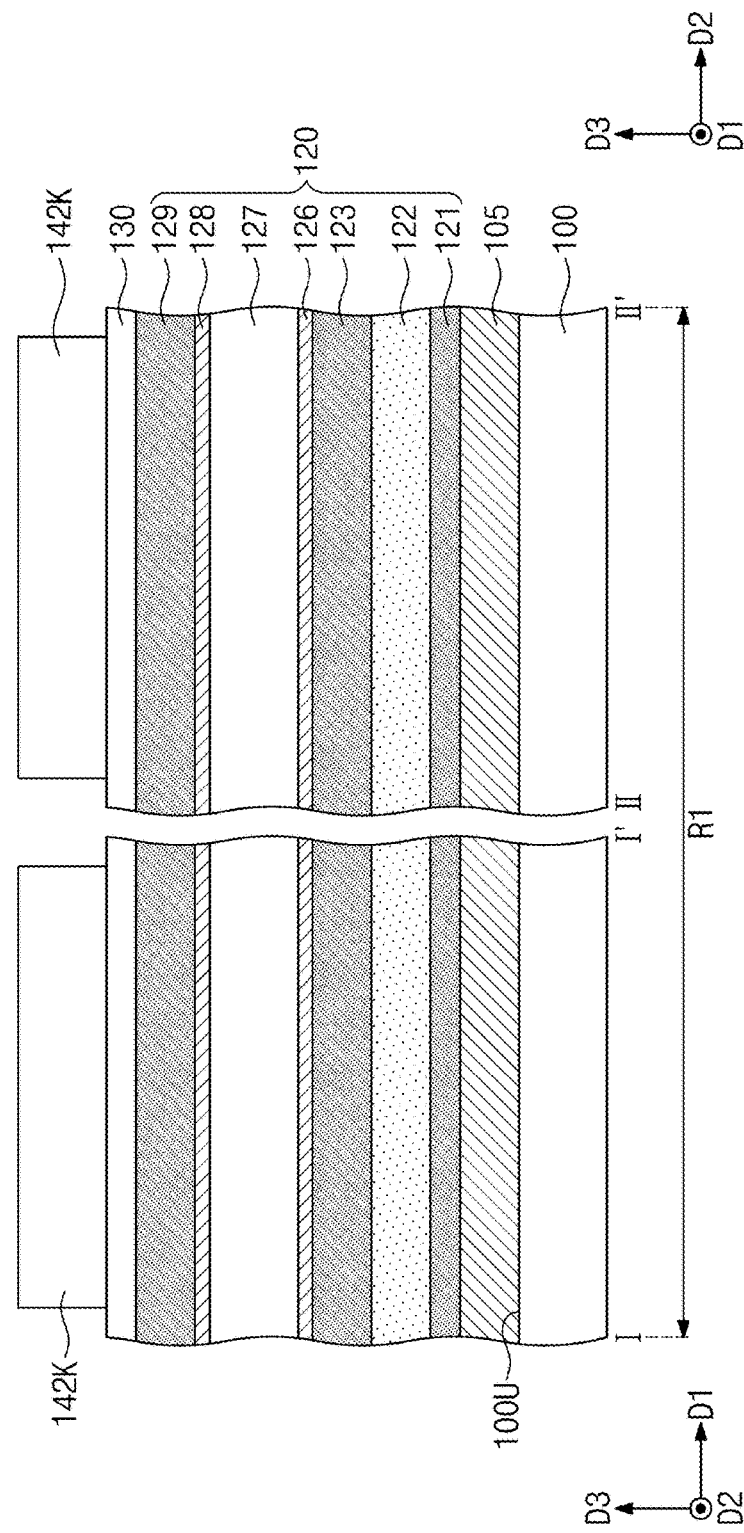
Figure 18:
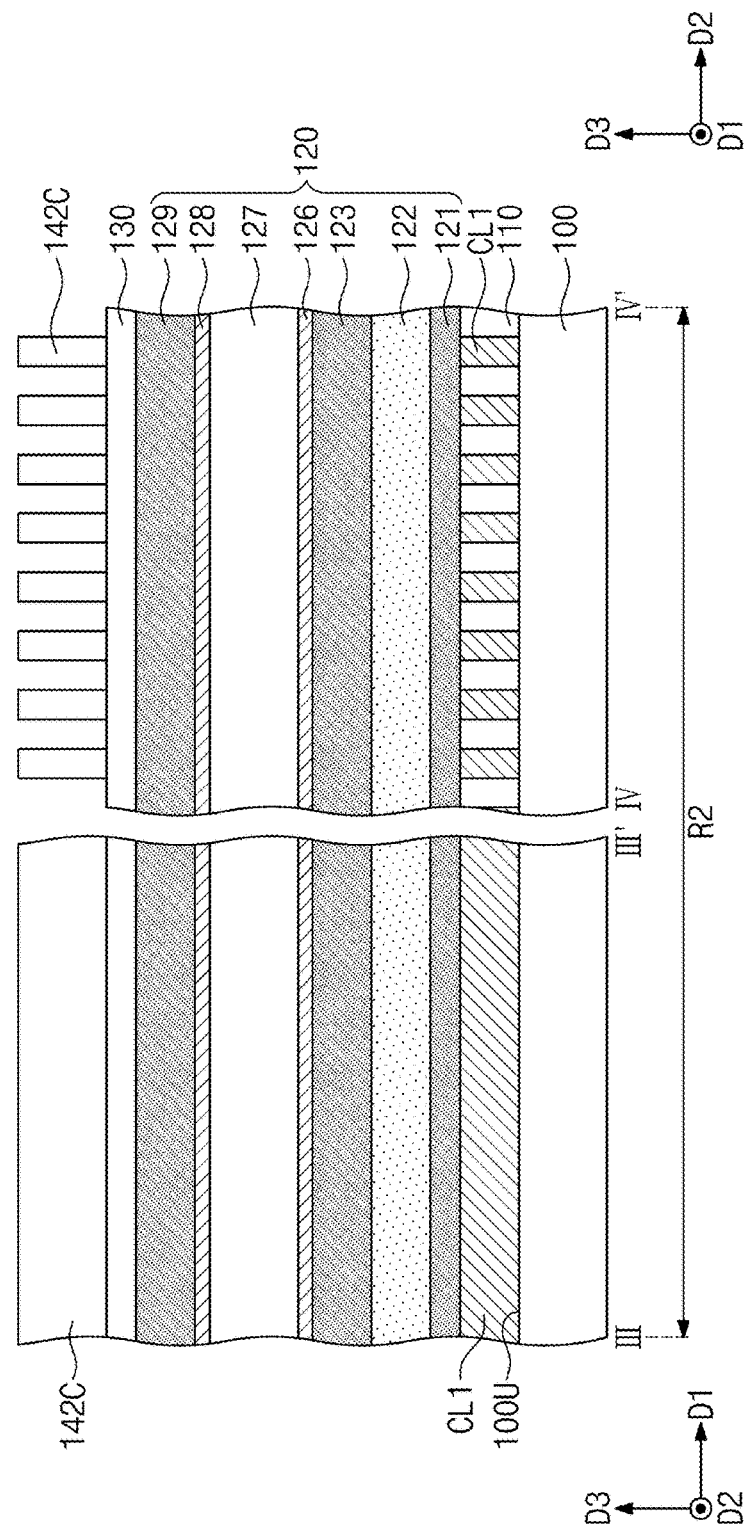

Referring to FIGS. 16 to 18, the first spacer patterns 152 and the first blocking pattern 155 may be used as an etching mask to etch the first mask layer 140. Therefore, first preliminary cell mask patterns 142C may be formed on the protection layer 130 of the cell region R2, and a first preliminary key mask pattern 142K may be formed on the protection layer 130 of the key region R1. The first preliminary cell mask patterns 142C and the first preliminary key mask pattern 142K may be simultaneously formed by an etching process of the first mask layer 140. The formation of the first preliminary cell mask patterns 142C and the first preliminary key mask pattern 142K may include etching the first mask layer 140 by using the first spacer patterns 152 and the first blocking pattern 155 as an etching mask, and thereafter removing the first spacer patterns 152, the first blocking pattern 155, and the first upper mask layer 144.

The first preliminary cell mask patterns 142C may be elongated in the first direction D1 and may be spaced apart from each other along the second direction D2. The first preliminary key mask pattern 142K may have a plate shape that extends in the first direction D1 and the second direction D2. The first preliminary cell mask patterns 142C and the first preliminary key mask pattern 142K may include, for example, silicon oxide.

Figure 19:
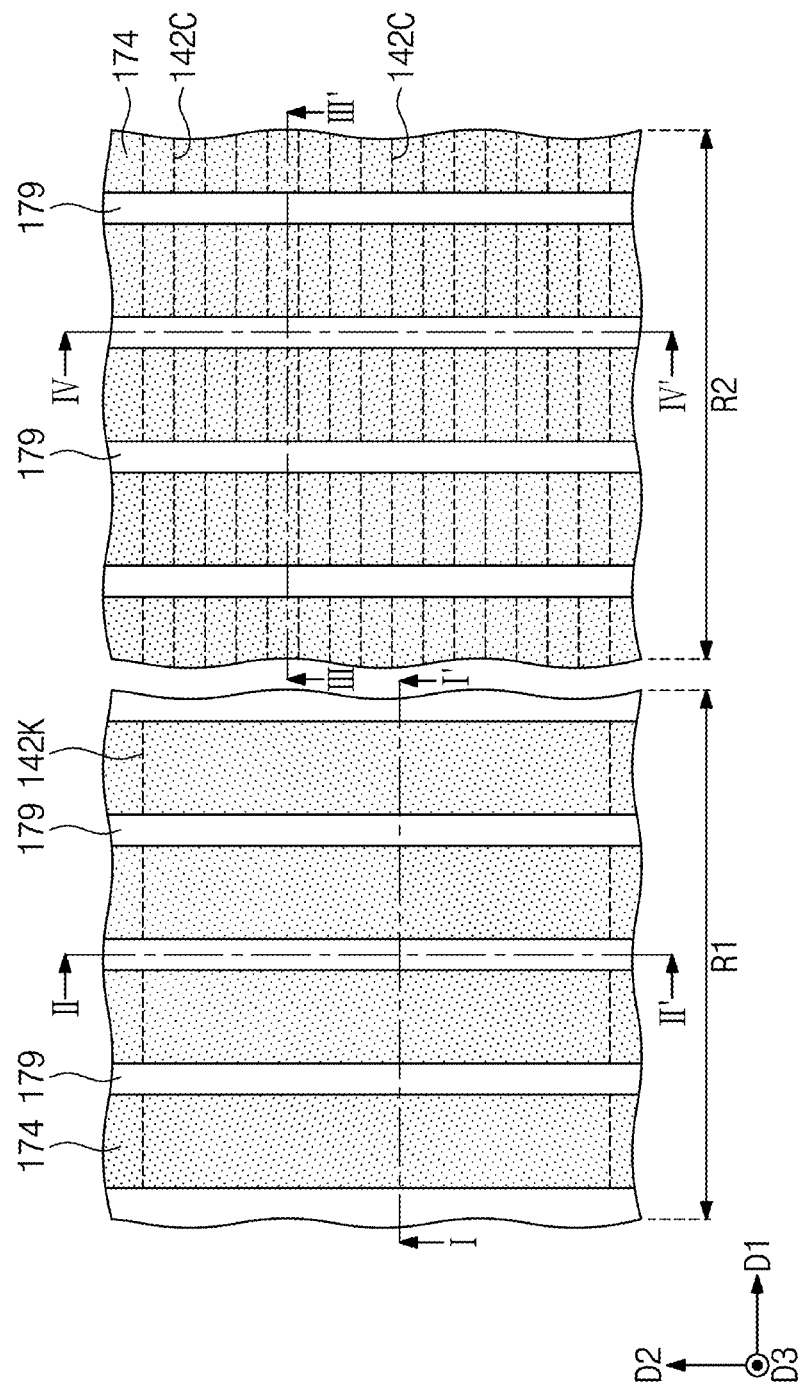
Figure 20:
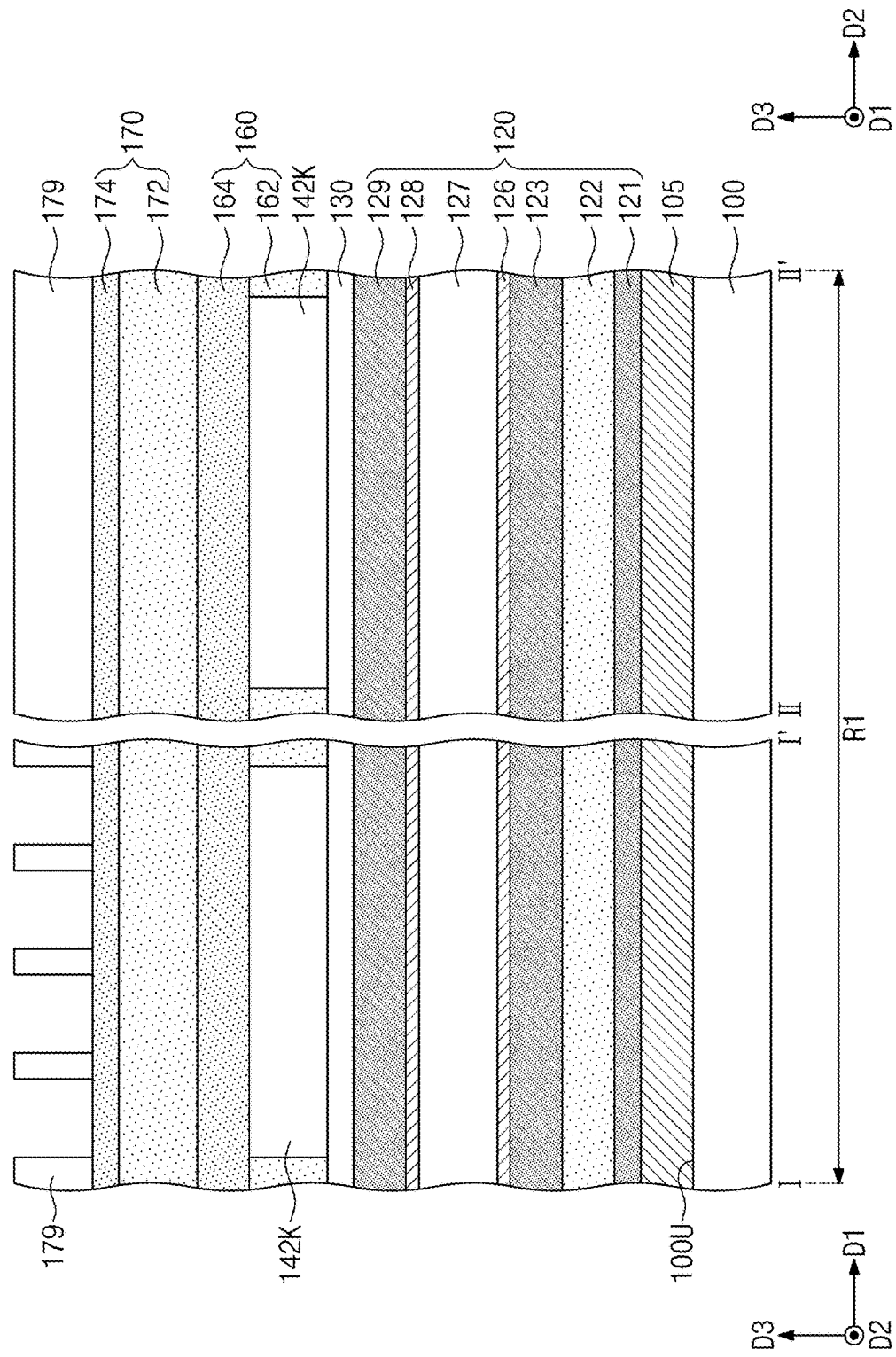
Figure 21:
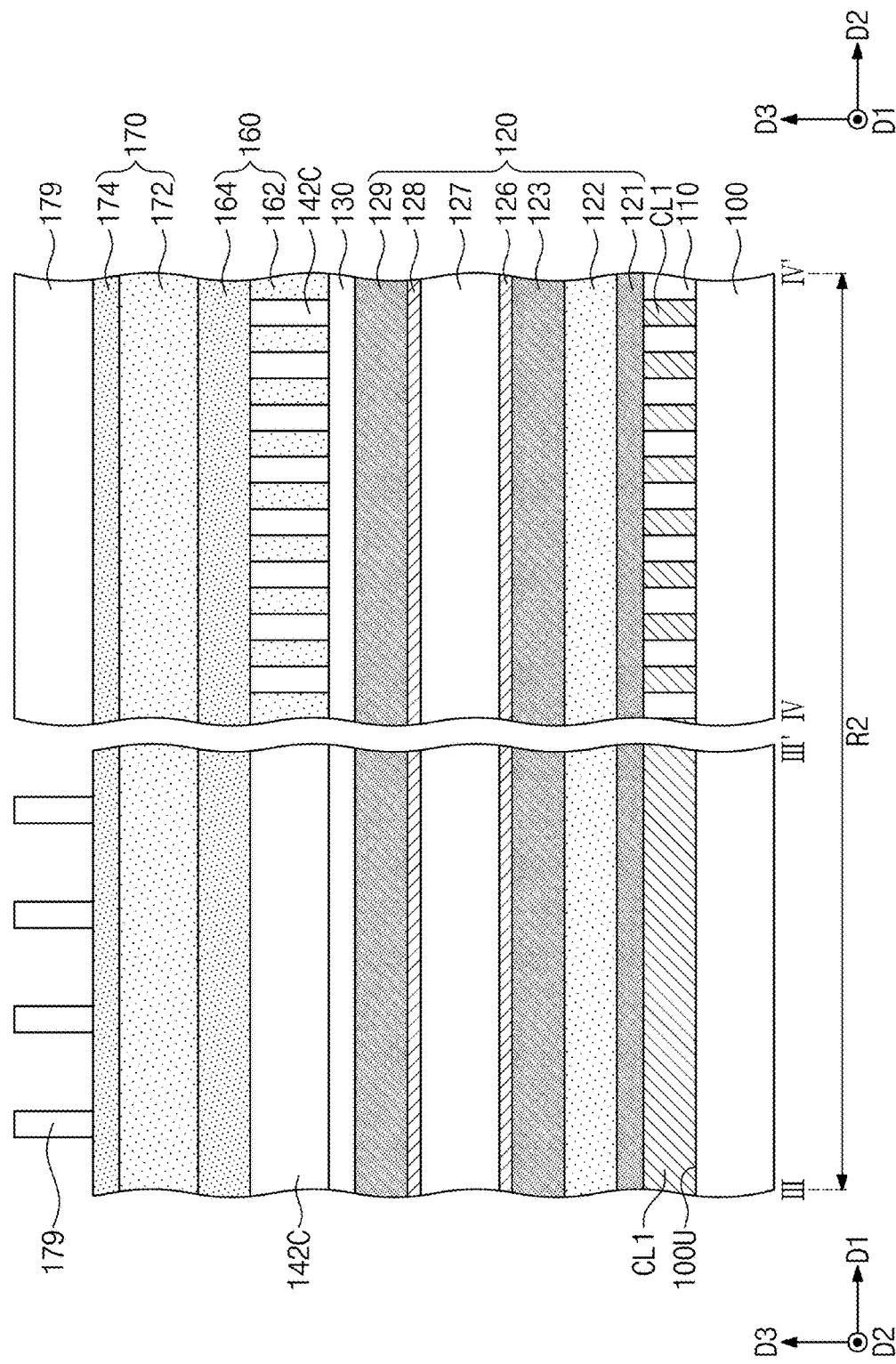

Referring to FIGS. 19 to 21, a second mask layer 160 may be formed on the protection layer 130 on the key and cell regions R1 and R2, thereby covering the first preliminary key mask pattern 142K and the first preliminary cell mask patterns 142C. The second mask layer 160 may include a second lower mask layer 162 that covers a lateral surface of the first preliminary key mask pattern 142K and lateral surfaces of the first preliminary cell mask patterns 142C, and may also include a second upper mask layer 164 on the second lower mask layer 162. The second lower mask layer 162 may expose a top surface of the first preliminary key mask pattern 142K and top surfaces of the first preliminary cell mask patterns 142C, and the second upper mask layer 164 may cover the exposed top surface of the first preliminary key mask pattern 142K and the exposed top surfaces of the first preliminary cell mask patterns 142C. For example, the second lower mask layer 162 may include a spin-on-hardmask (SOH) material, and the second upper mask layer 164 may include polycrystalline silicon.

A second sacrificial layer 170 may be formed on the second mask layer 160 of the key and cell regions R1 and R2. The second sacrificial layer 170 may include a second lower sacrificial layer 172 and a second upper sacrificial layer 174 that are sequentially stacked on the second mask layer 160. For example, the second lower sacrificial layer 172 may include a spin-on-hardmask (SOH) material, and the second upper sacrificial layer 174 may include silicon oxynitride.

Second photoresist patterns 179 may be formed on the second sacrificial layer 170 of the key and cell regions R1 and R2. The second photoresist patterns 179 on the key region R1 may be spaced apart from each other in the first direction D1 and may be elongated along the second direction D2. The second photoresist patterns 179 on the key region R1 may vertically overlap the first preliminary key mask pattern 142K. The second photoresist patterns 179 on the cell region R2 may be spaced apart from each other in the first direction D1 and may be elongated along the second direction D2. The second photoresist patterns 179 on the cell region R2 may run across the first preliminary cell mask patterns 142C.

Figure 22:
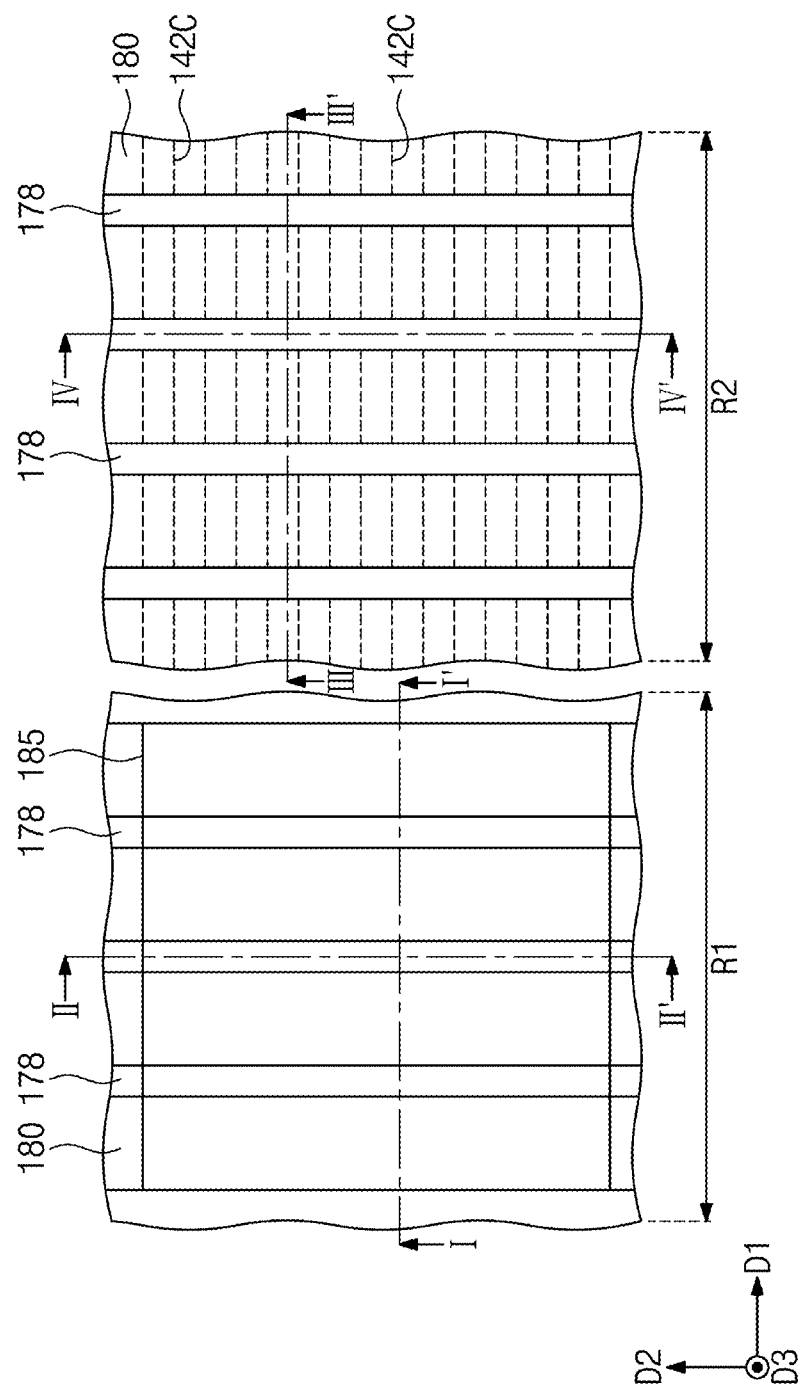
Figure 23:
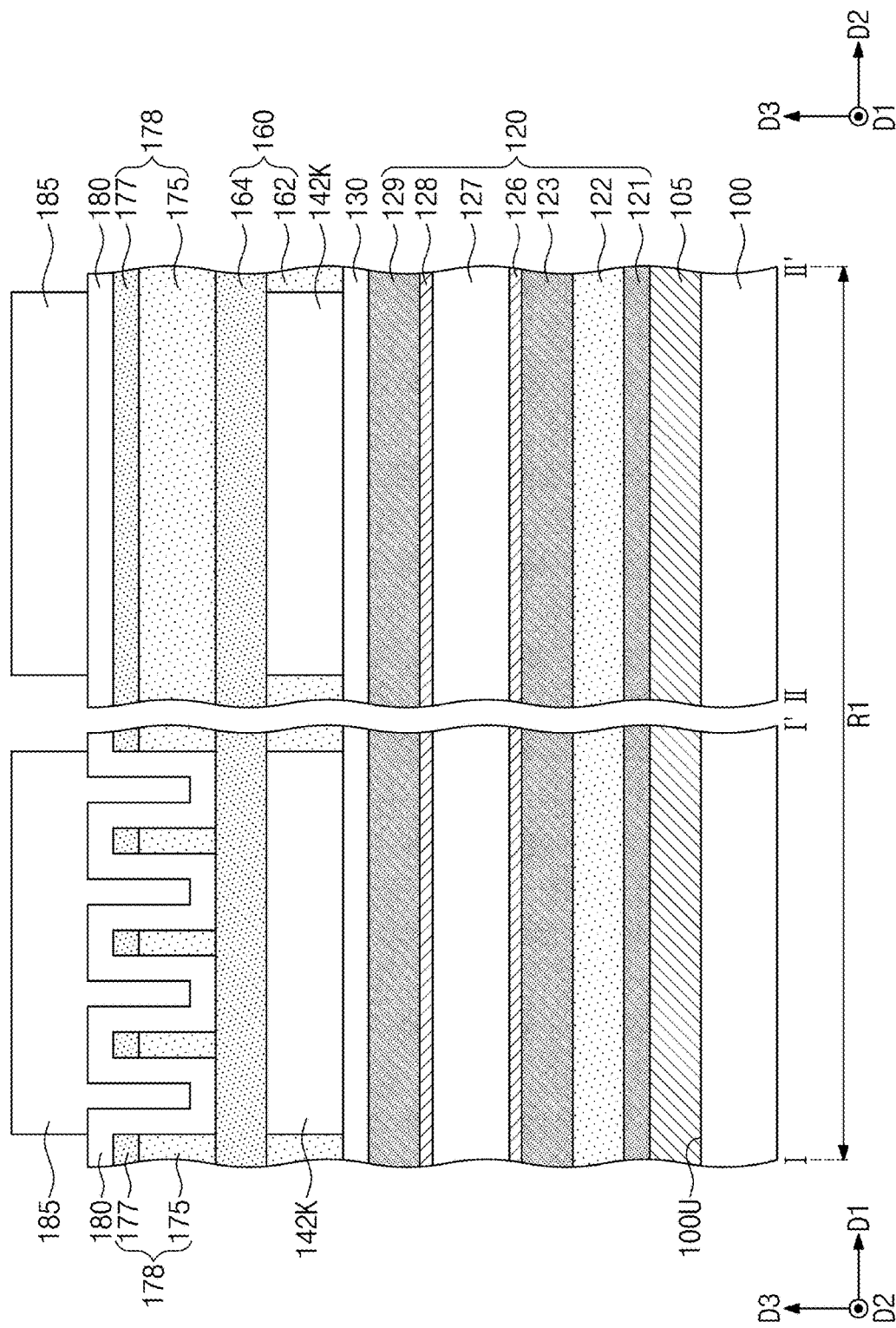
Figure 24:
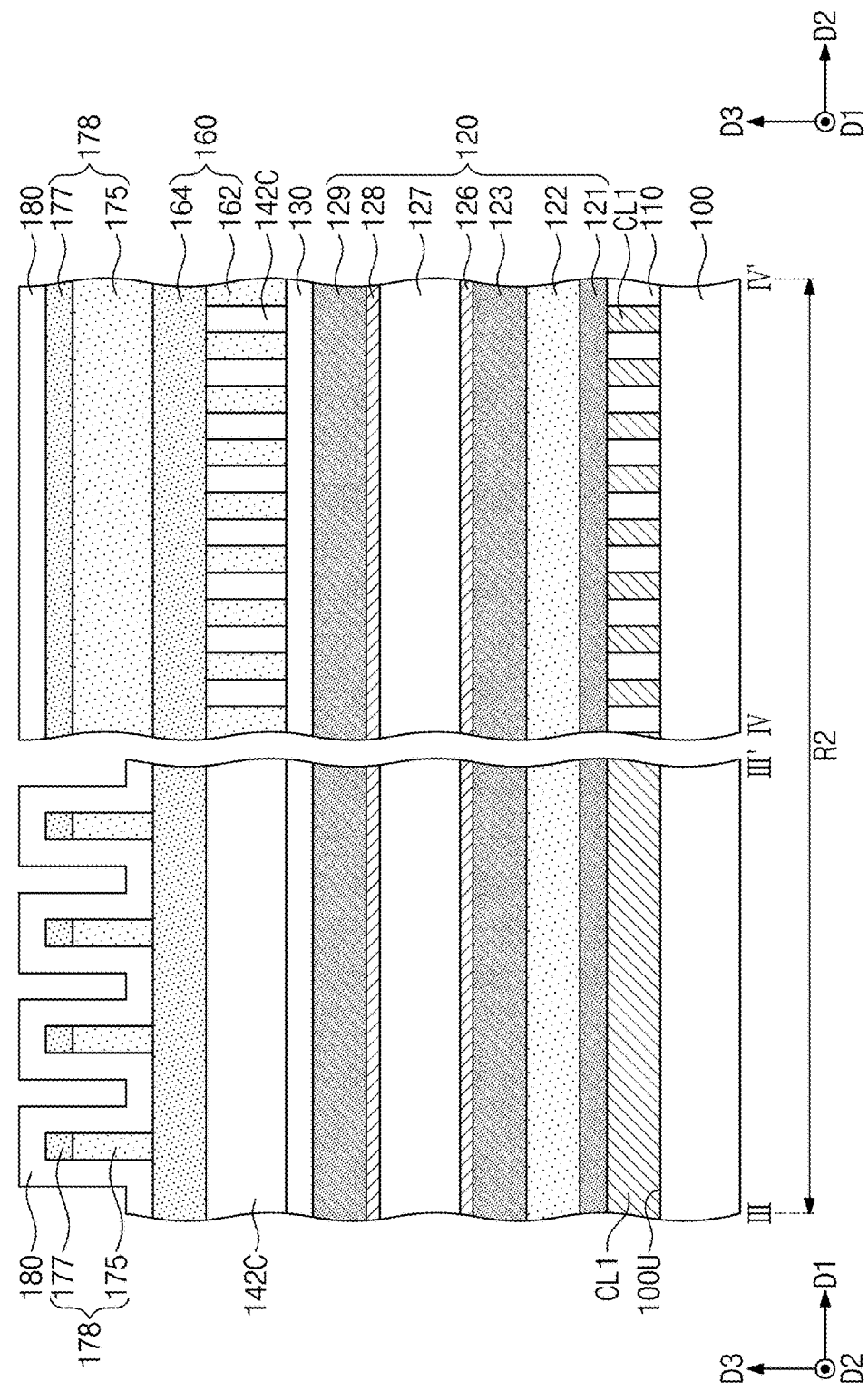

Referring to FIGS. 22 to 24, the second photoresist patterns 179 may be used as an etching mask to etch the second sacrificial layer 170. Therefore, second sacrificial patterns 178 may be formed on the second mask layer 160 of the key and cell regions R1 and R2. The second sacrificial patterns 178 on the key region R1 may be spaced apart from each other in the first direction D1 and may be elongated along the second direction D2. The second sacrificial patterns 178 on the key region R1 may vertically overlap the first preliminary key mask pattern 142K. The second sacrificial patterns 178 on the cell region R2 may be spaced apart from each other in the first direction D1 and may be elongated along the second direction D2. The second sacrificial patterns 178 on the cell region R2 may run across the first preliminary cell mask patterns 142C.

Each of the second sacrificial patterns 178 may include a second lower sacrificial pattern 175 and a second upper sacrificial pattern 177 that are sequentially stacked on the second mask layer 160. The etching of the second sacrificial layer 170 may include using the second photoresist patterns 179 as an etching mask to sequentially etch the second upper sacrificial layer 174 and the second lower sacrificial layer 172, thereby forming the second lower sacrificial pattern 175 and the second upper sacrificial pattern 177. For example, the second lower sacrificial pattern 175 may include a spin-on-hardmask (SOH) material, and the second upper sacrificial pattern 177 may include silicon oxynitride.

After the second sacrificial patterns 178 are formed, the second photoresist patterns 179 may be removed. The second photoresist patterns 179 may be removed by, for example, one or both of an ashing process and a strip process.

A second spacer layer 180 may be formed on the second mask layer 160 of the key and cell regions R1 and R2, thereby covering the second sacrificial patterns 178. The second spacer layer 180 may conformally cover top and lateral surfaces of the second sacrificial patterns 178 on the key region R1, and may conformally cover top and lateral surfaces of the second sacrificial patterns 178 on the cell region R2. The second spacer layer 180 may cover a top surface of the second mask layer 160 between the second sacrificial patterns 178. For example, the second spacer layer 180 may be formed by an atomic layer deposition process and may include silicon oxide.

A second blocking pattern 185 may be formed on the second spacer layer 180 of the key region R1. The second blocking pattern 185 may vertically overlap the first preliminary key mask pattern 142K, and may vertically overlap at least portions of the second sacrificial patterns 178 on the key region R1. The second blocking pattern 185 may have a plate shape that extends in the first direction D1 and the second direction D2. The second blocking pattern 185 may be formed by performing a photolithography process after the formation of the second spacer layer 180. The second blocking pattern 185 may be a photoresist pattern formed by the photolithography process.

Figure 25:
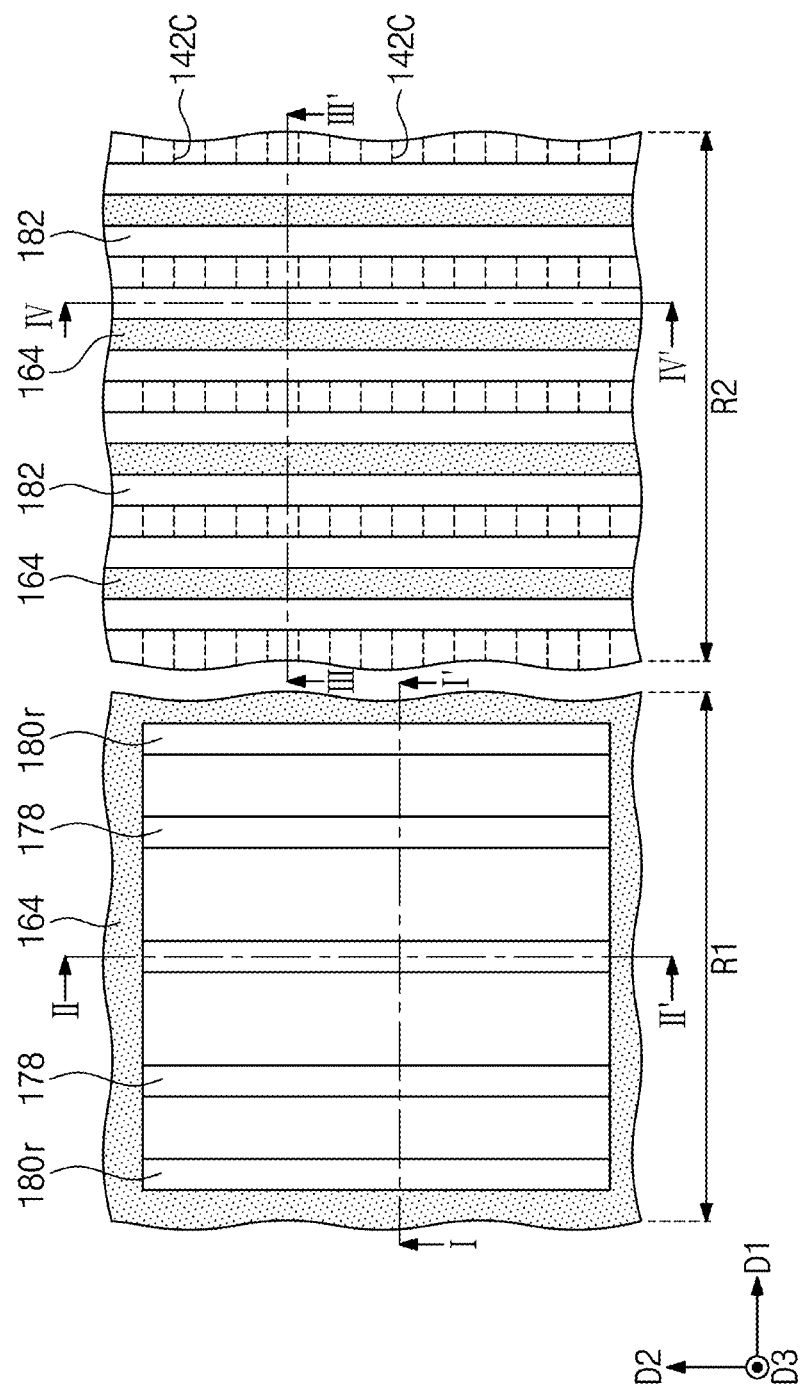
Figure 26:
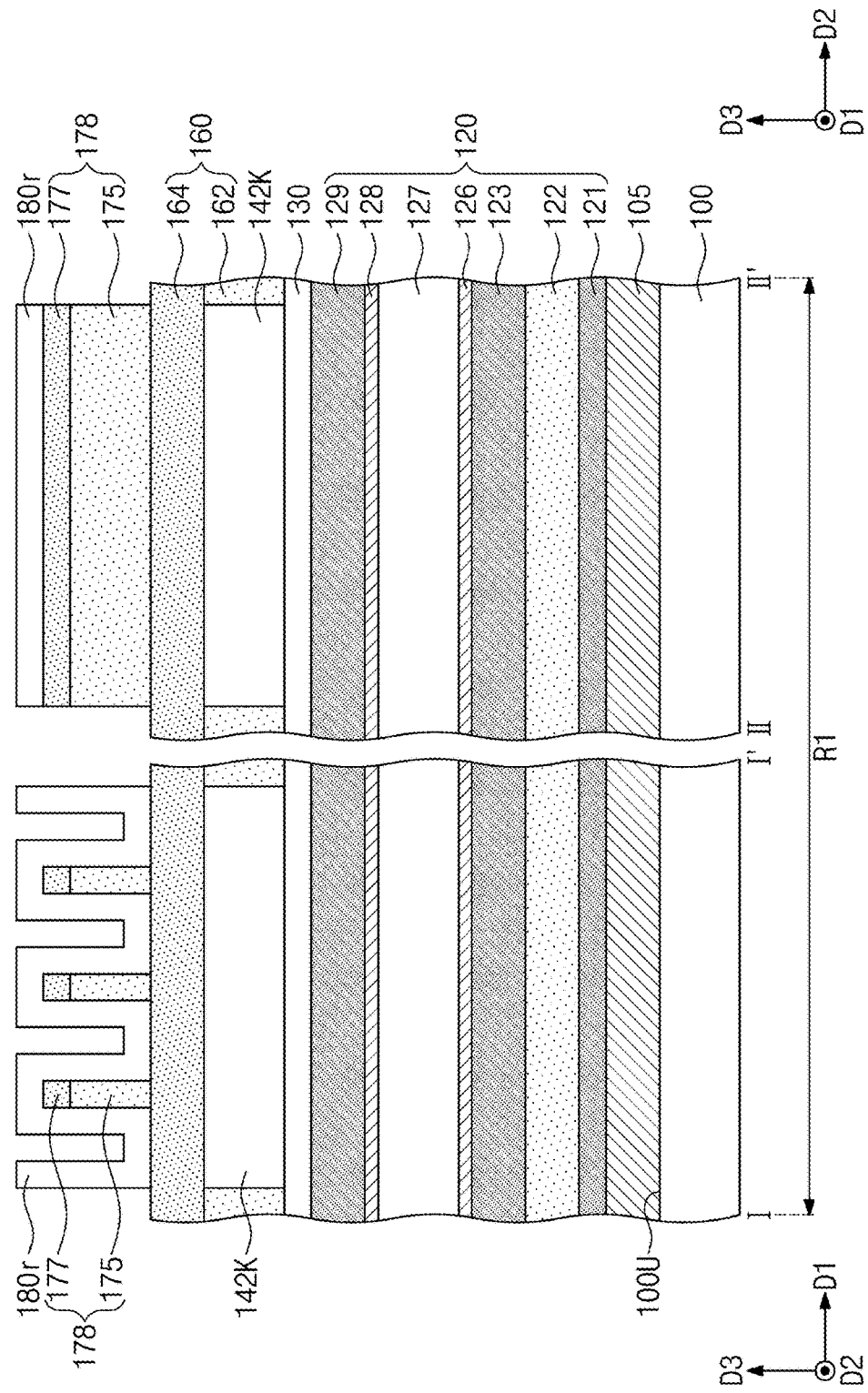
Figure 27:
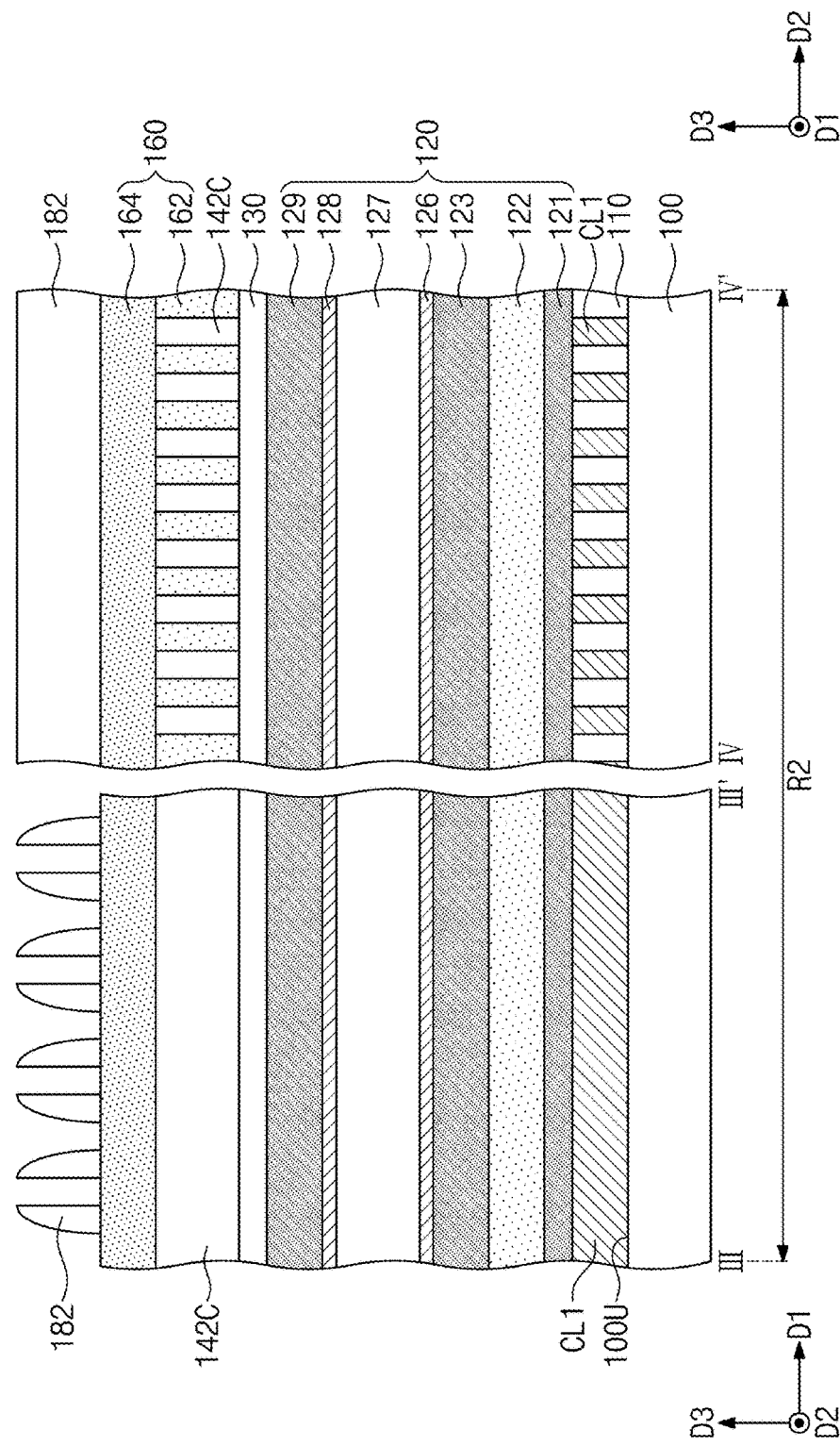

Referring to FIGS. 25 to 27, the second blocking pattern 185 may be used as an etching mask to anisotropically etch the second spacer layer 180.

The anisotropic etching of the second spacer layer 180 may form second spacer patterns 182 on opposite lateral surfaces of each of the second sacrificial patterns 178 on the cell region R2. While the second spacer layer 180 is anisotropically etched, the second upper sacrificial pattern 177 of each of the second sacrificial patterns 178 may be removed, and thus the second spacer patterns 182 may be formed on opposite lateral surfaces of the second lower sacrificial pattern 175 of each of the second sacrificial patterns 178. The second spacer patterns 182 may be spaced apart from each other along the first direction D1 and may be elongated in the second direction D2. The second spacer patterns 182 may run across the first preliminary cell mask patterns 142C.

The second blocking pattern 185 may be used as an etching mask while the second spacer layer 180 is anisotropically etched. Therefore, the anisotropic etching of the second spacer layer 180 may partially remove the second spacer layer 180 and the second sacrificial patterns 178 that are exposed by the second blocking pattern 185. A remainder 180r of the second spacer layer 180 and remainders of the second sacrificial patterns 178, which are vertically overlapped the second blocking pattern 185, remain on the second mask layer 160 of the key region R1 without being removed by the anisotropic etching of the second spacer layer 180.

After the anisotropic etching of the second spacer layer 180, the second blocking pattern 185 and the second lower sacrificial pattern 175 between the second spacer patterns 182 may be removed. The second blocking pattern 185 and the second lower sacrificial pattern 175 between the second spacer patterns 182 may be removed by, for example, one or both of an ashing process and a strip process.

Figure 28:
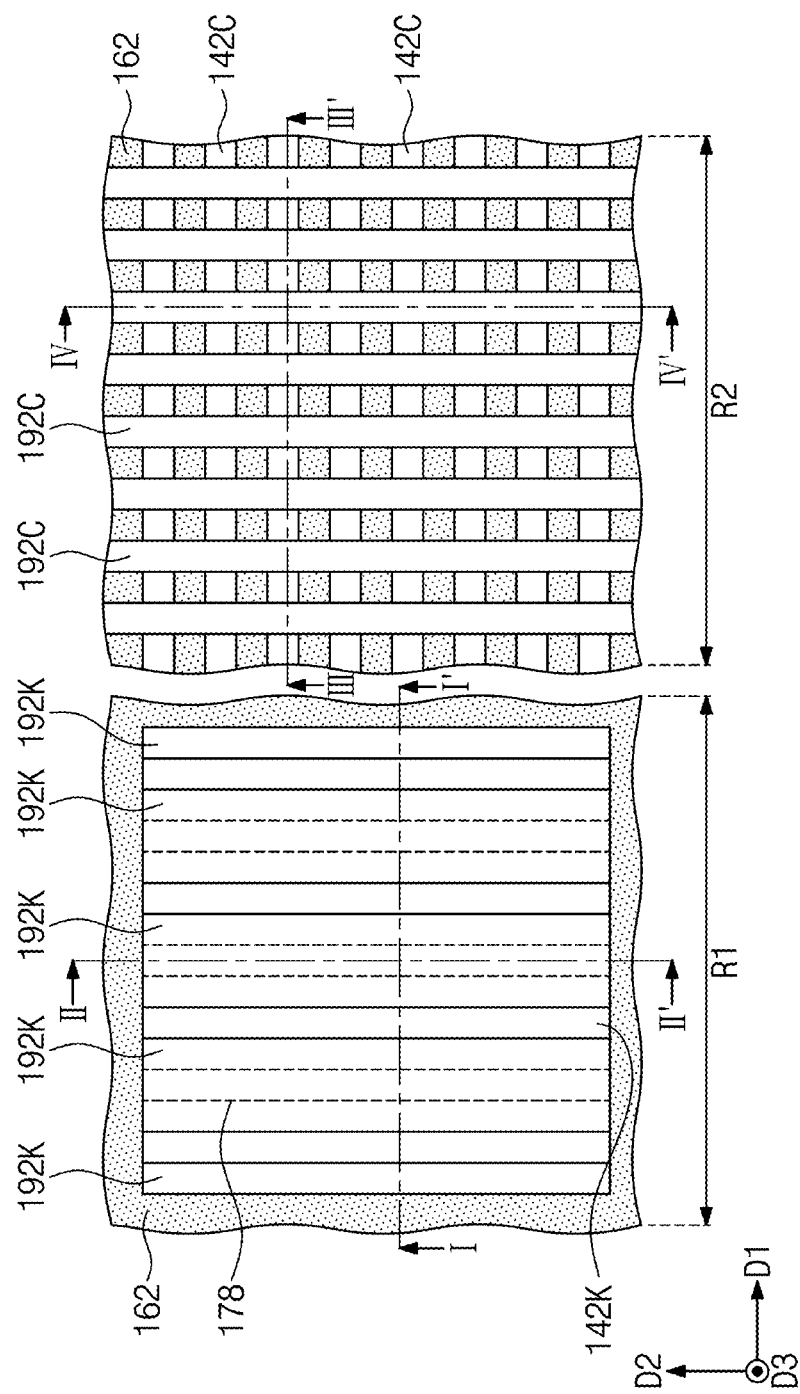
Figure 29:
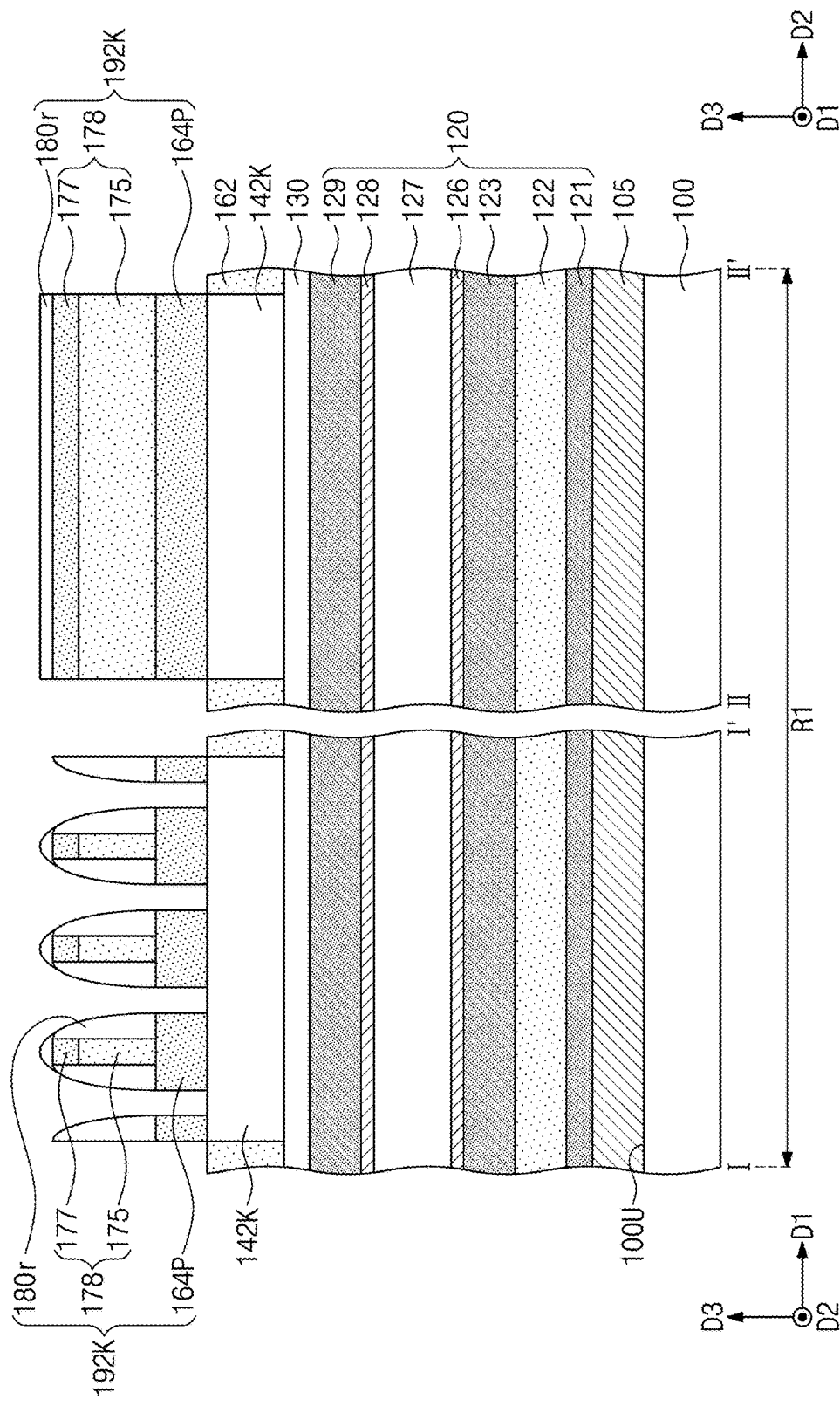
Figure 30:
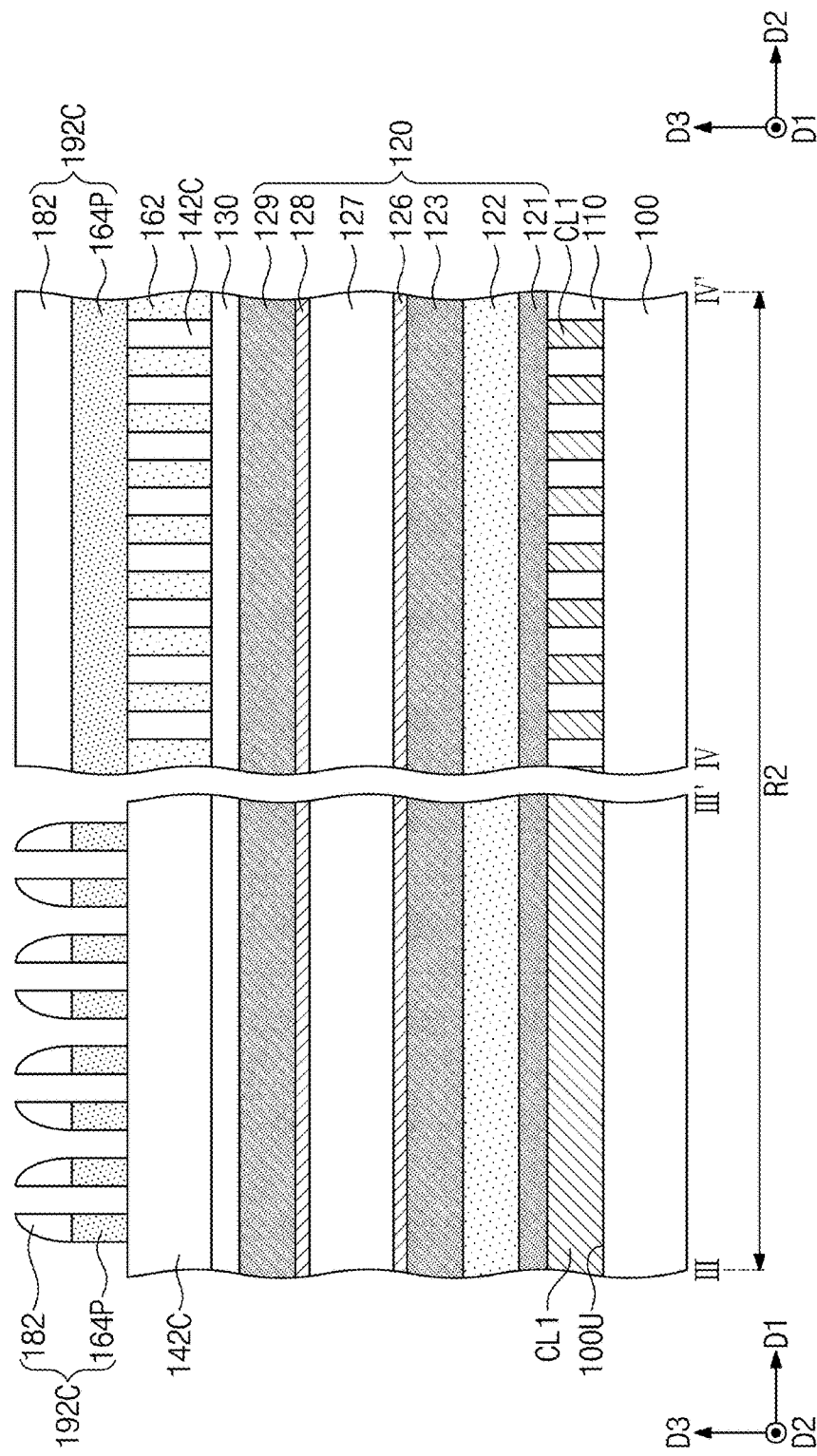

Referring to FIGS. 28 to 30, the second spacer patterns 182 on the cell region R2, the remainder 180r of the second spacer layer 180 on the key region R1, and the remainders of the second sacrificial patterns 178 on the key region R1 may be used as an etching mask to etch an upper portion (or the second upper mask layer 164) of the second mask layer 160. Therefore, second preliminary key mask patterns 192K may be formed on the first preliminary key mask pattern 142K of the key region R1, and second preliminary cell mask patterns 192C may be formed on the first preliminary cell mask patterns 142C of the cell region R2. The second preliminary key mask patterns 192K and the second preliminary cell mask patterns 192C may be simultaneously formed by an etching process of the second upper mask layer 164.

The etching of the upper portion (or the second upper mask layer 164) of the second mask layer 160 may form second upper mask patterns 164P on the key and cell regions R1 and R2. Upper portions of the second spacer patterns 182 may be etched while the second upper mask layer 164 is etched, and thus residues of the second spacer patterns 182 may remain on corresponding second upper mask patterns 164P on the cell region R2. The second preliminary cell mask pattern 192C may include the second upper mask pattern 164P on the cell region R2 and the residue of the second spacer pattern 182. The second preliminary cell mask patterns 192C may run across the first preliminary cell mask patterns 142C. The second preliminary cell mask patterns 192C may be spaced apart from each other along the first direction D1 and may be elongated in the second direction D2.

The remainder 180r of the second spacer layer 180 may be partially etched while the second upper mask layer 164 is etched, and thus may locally remain on the second upper mask patterns 164P on the key region R1. The remainders of the second sacrificial patterns 178 may remain on corresponding ones of the second upper mask patterns 164P on the key region R1. At least one of the second preliminary key mask patterns 192K may include a corresponding second upper mask pattern 164P, a corresponding second sacrificial pattern 178 on the corresponding second upper mask pattern 164P, and the remainder 180r of the second spacer layer 180 that is disposed on the corresponding second upper mask pattern 164P and covers the lateral surfaces of the corresponding second sacrificial pattern 178. At least another of the second preliminary key mask patterns 192K may include a corresponding second upper mask pattern 164P and the remainder 180r of the second spacer layer 180 disposed on the corresponding second upper mask pattern 164P. The at least another of the second preliminary key mask patterns 192K may not include the remainders of the second sacrificial patterns 178. The second preliminary key mask patterns 192K may vertically overlap the first preliminary key mask pattern 142K. On the first preliminary key mask pattern 142K, the second preliminary key mask patterns 192K may be spaced apart from each other along the first direction D1 and may be elongated in the second direction D2.

Figure 31:
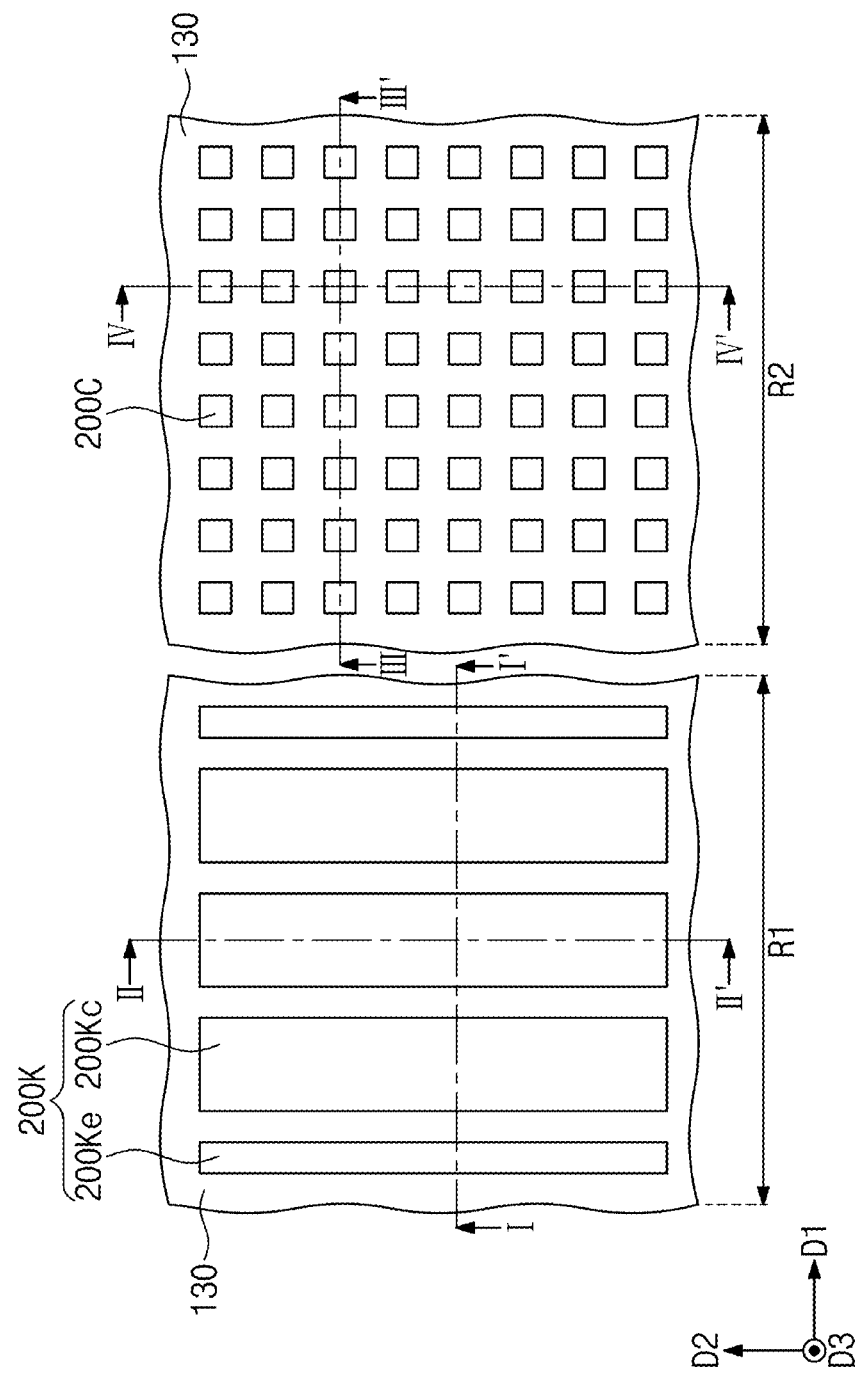
Figure 32:
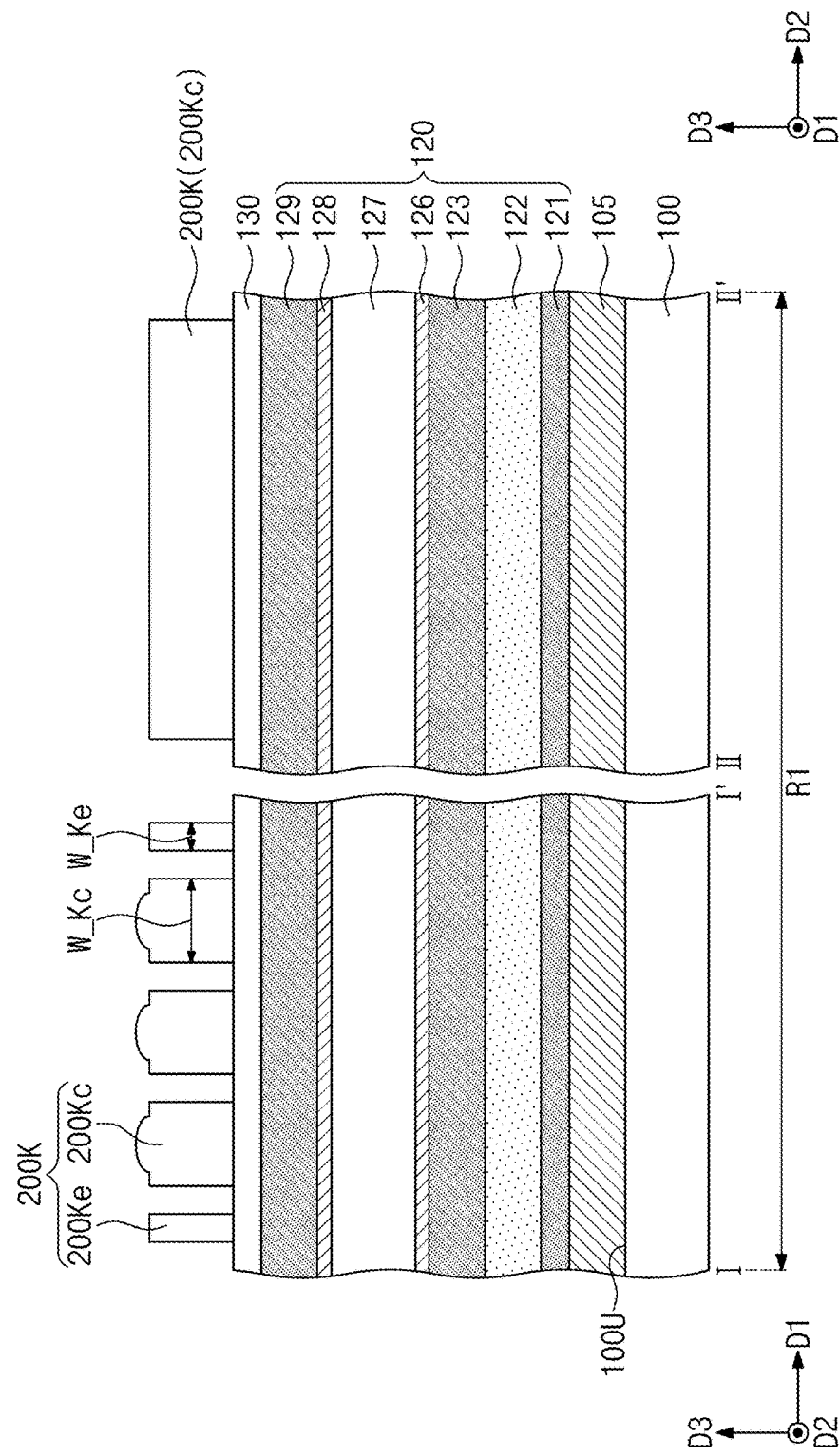
Figure 33:
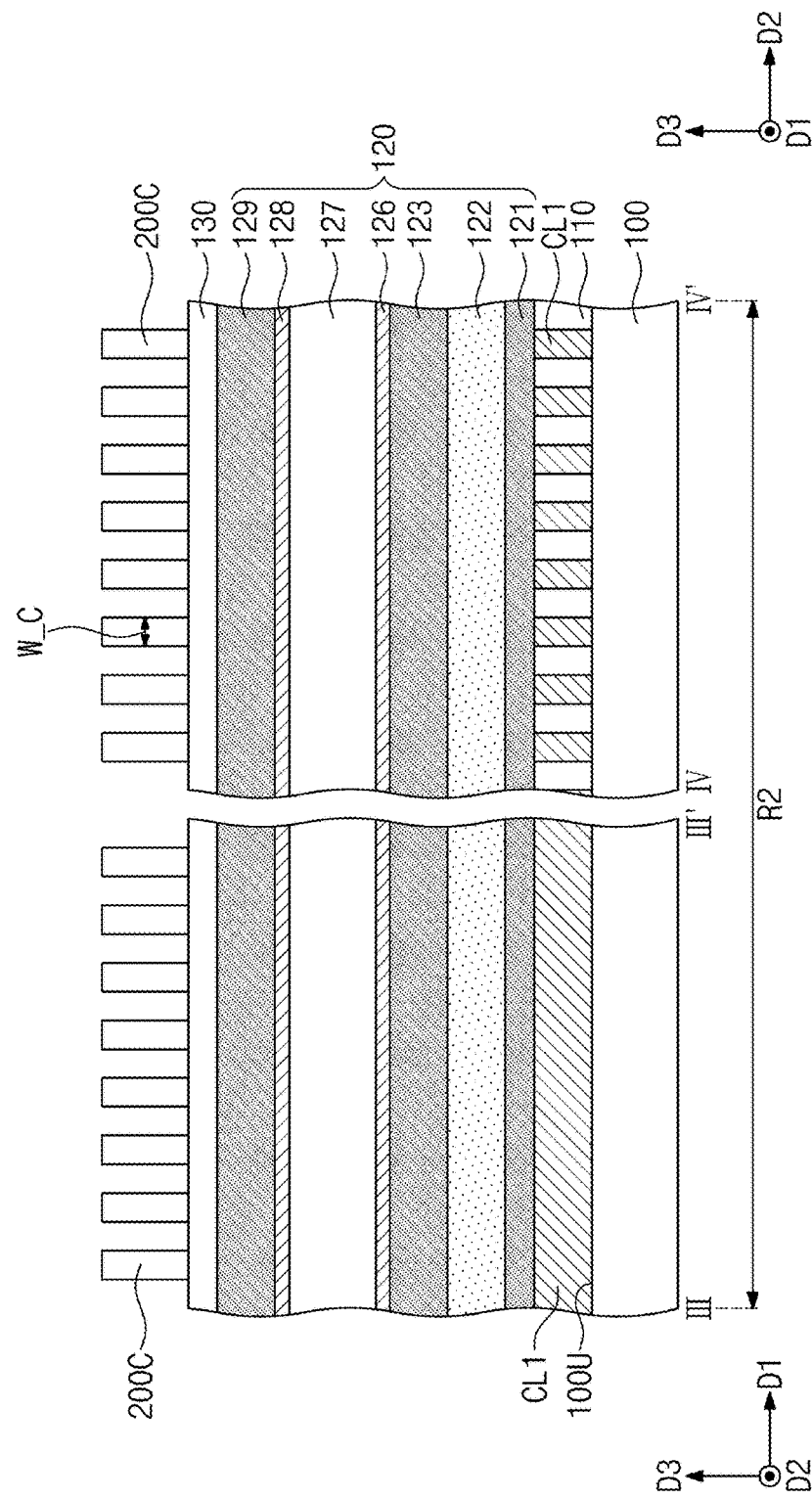

Referring to FIGS. 31 to 33, the second preliminary key mask patterns 192K and the second preliminary cell mask patterns 192C may be used as an etching mask to etch the first preliminary key mask pattern 142K and the first preliminary cell mask patterns 142C. Therefore, key mask patterns 200K may be formed on the protection layer 130 of the key region R1, and cell mask patterns 200C may be formed on the protection layer 130 of the cell region R2. The key mask patterns 200K and the cell mask patterns 200C may be simultaneously formed by an etching process of the first preliminary key mask pattern 142K and the first preliminary cell mask patterns 142C.

The key mask patterns 200K may be spaced apart from each other along the first direction D1 and may be elongated in the second direction D2. The cell mask patterns 200C may be two-dimensionally spaced apart from each other along the first direction D1 and the second direction D2. The key mask patterns 200K may define areas where key patterns will be formed as discussed below, and the cell mask patterns 200C may define areas where memory cells will be formed as discussed below.

The key mask patterns 200K may include edge key mask patterns 200Ke that are spaced apart from each other in the first direction D1, and may also central key mask patterns 200Kc that are spaced apart from each other in the first direction D1 between the edge key mask patterns 200Ke. Each of the key mask patterns 200K may have a width in the first direction D1, and a width W_Kc of each of the central key mask patterns 200Kc may be greater than a width W_Ke of each of the edge key mask patterns 200Ke. For example, the width W_Kc of each of the central key mask patterns 200Kc may be about three times the width W_Ke of each of the edge key mask patterns 200Ke.

Each of the cell mask patterns 200C may have a width W_C in the first direction D1. The width W_Kc of each of the central key mask patterns 200Kc may be greater than the width W_C of each of the cell mask patterns 200C. For example, the width W_Kc of each of the central key mask patterns 200Kc may be three times the width W_C of each of the cell mask patterns 200C. The width W_Ke of each of the edge key mask patterns 200Ke may be the same as the width W_C of each of the cell mask patterns 200C.

Figure 34:
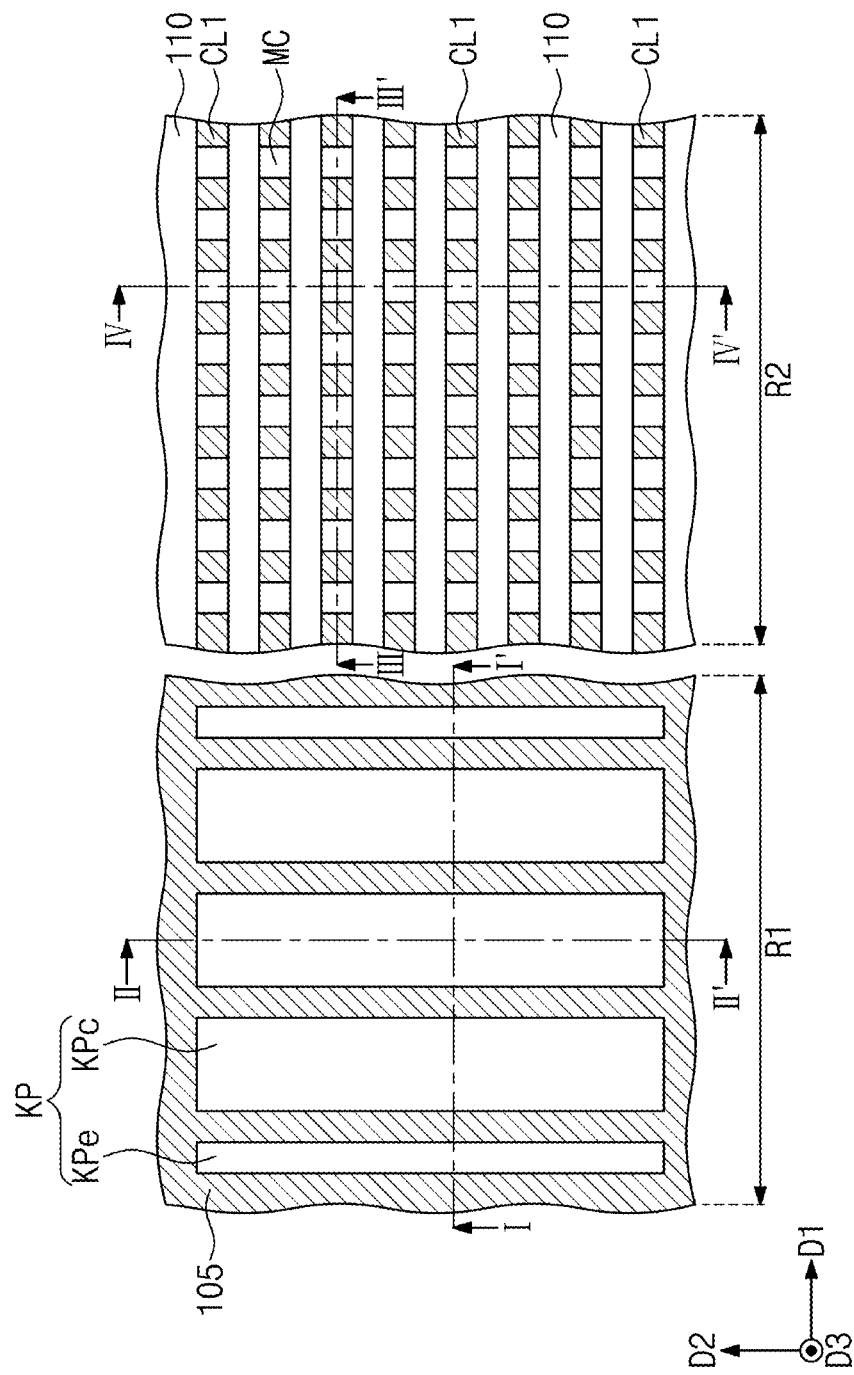
Figure 35:
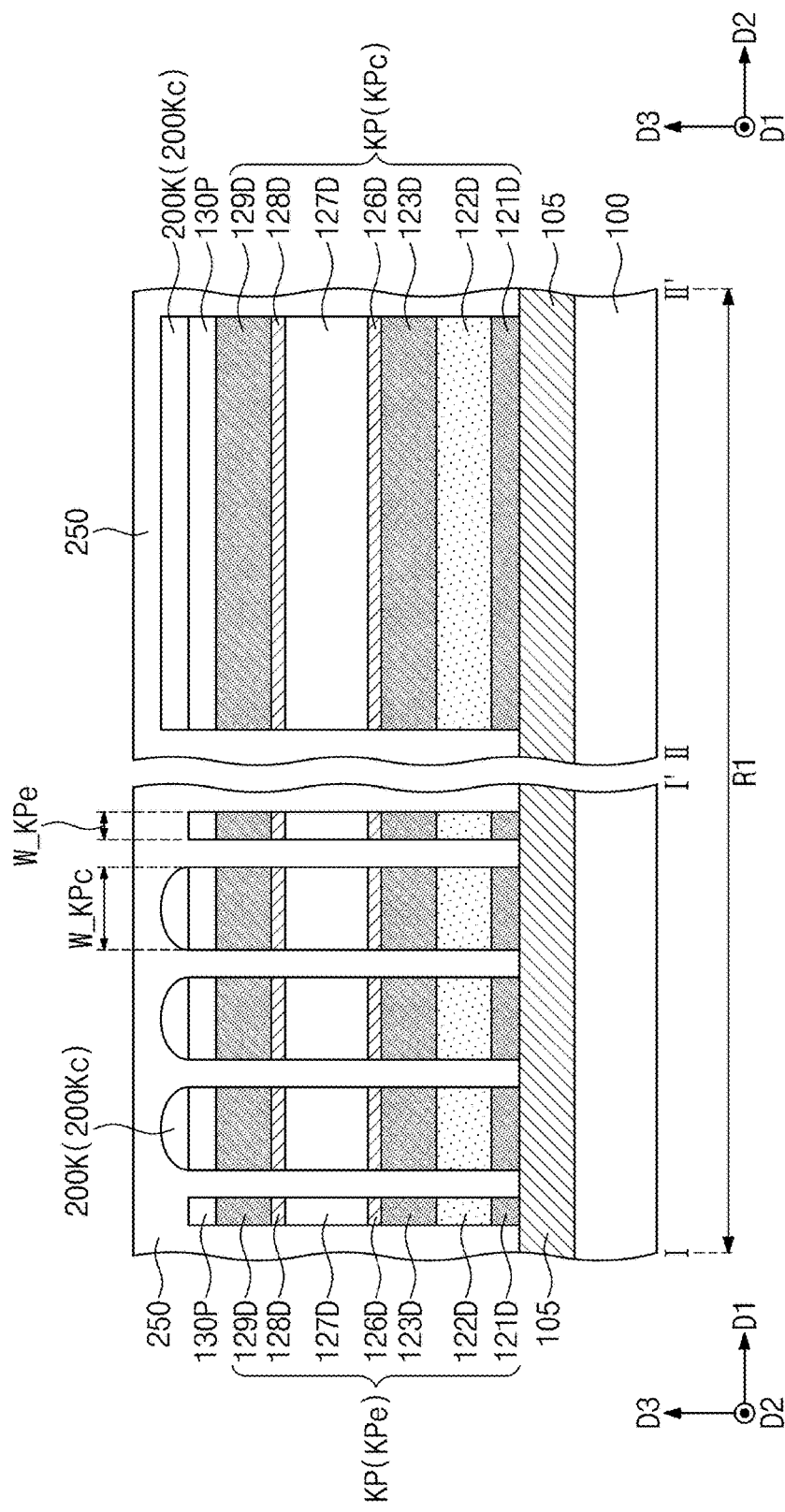
Figure 36:
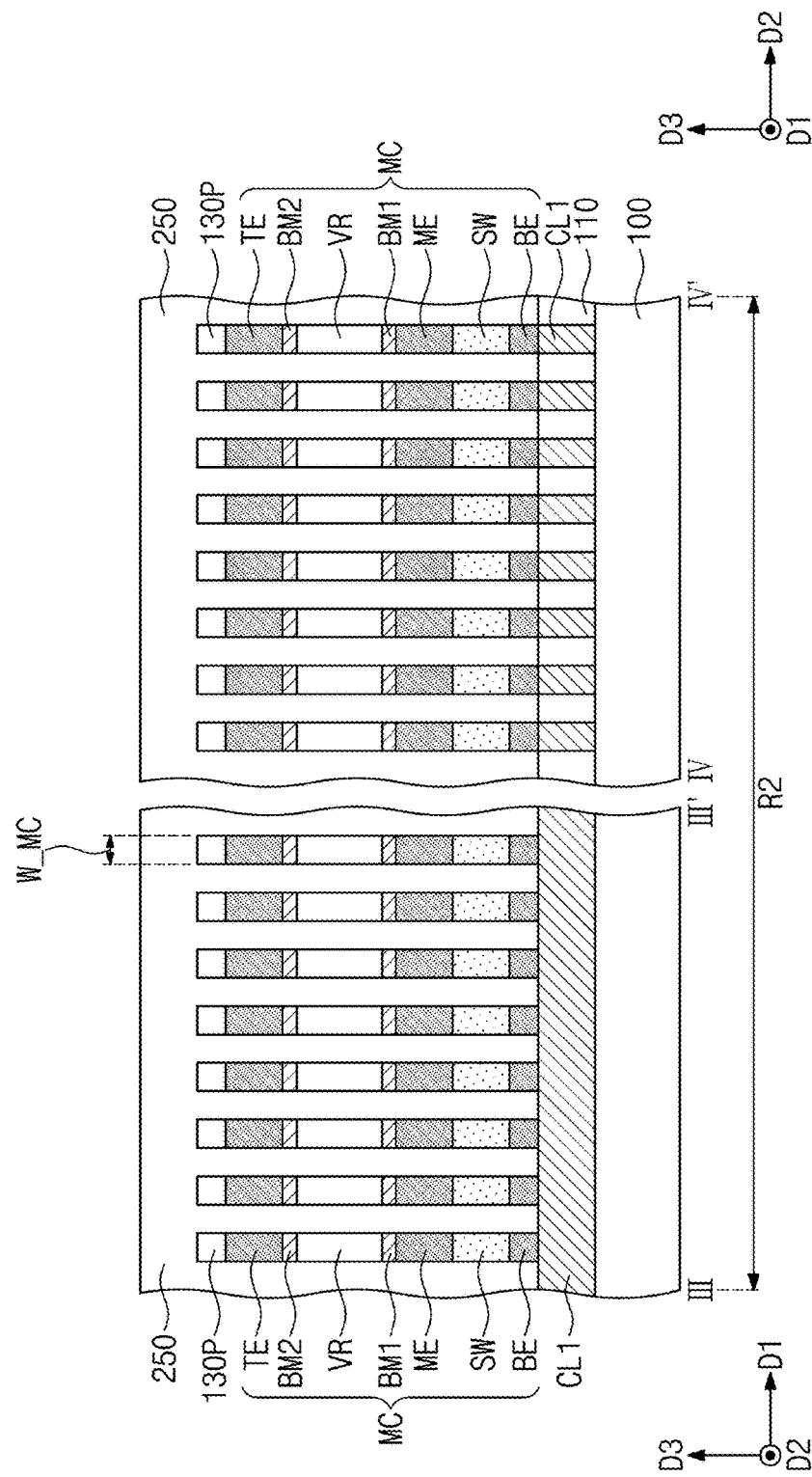

Referring to FIGS. 34 to 36, the key mask patterns 200K and the cell mask patterns 200C may be used as an etching mask to etch the protection layer 130 and the cell stack layer 120. As the protection layer 130 is etched by using the key mask patterns 200K and the cell mask patterns 200C as an etching mask, protection patterns 130P may be formed on the key region R1 and the cell region R2. As the cell stack layer 120 is etched by using the key mask patterns 200K and the cell mask patterns 200C as an etching mask, key patterns KP may be formed on the conductive pattern 105 of the key region R1 and memory cells MC may be formed on the first conductive lines CL1 of the cell region R2. The key patterns KP may be spaced apart from each other along the first direction D1 and may be elongated in the second direction D2. The memory cells MC may be two-dimensionally arranged along the first direction D1 and the second direction D2. Each of the memory cells MC may be connected to a corresponding one of the first conductive lines CL1. The protection patterns 130P may be correspondingly disposed on the key patterns KP and the memory cells MC. The key patterns KP and the memory cells MC may be simultaneously formed by an etching process of the cell stack layer 120.

The formation of the key patterns KP may include using the key mask patterns 200K as an etching mask to sequentially etch the third electrode layer 129, the second metal layer 128, the variable resistance layer 127, the first metal layer 126, the second electrode layer 123, the switching layer 122, and the first electrode layer 121 of the cell stack layer 120. Therefore, each of the key patterns KP may include a first dummy electrode 121D, a dummy switching pattern 122D, a second dummy electrode 123D, a first dummy metal pattern 126D, a dummy variable resistance pattern 127D, a second dummy metal pattern 128D, and a third dummy electrode 129D that are sequentially stacked along the third direction D3.

The formation of the memory cells MC may include using the cell mask patterns 200C as an etching mask to sequentially etch the third electrode layer 129, the second metal layer 128, the variable resistance layer 127, the first metal layer 126, the second electrode layer 123, the switching layer 122, and the first electrode layer 121 of the cell stack layer 120. Therefore, each of the memory cells MC may include a first electrode BE, a switching pattern SW, a second electrode ME, a first metal pattern BM1, a variable resistance pattern VR, a second metal pattern BM2, and a third electrode TE that are sequentially stacked along the third direction D3.

The first, second, and third electrodes BE, ME, and TE may include a conductive material. For example, the first, second, and third electrodes BE, ME, and TE may be a carbon electrode including carbon. The first, second, and third electrodes BE, ME, and TE may include one or more of metal and metal nitride. The first and second metal patterns BM1 and BM2 may include at least one selected from W, Ti, Al, Cu, C, CN, TiN, TiAlN, TiSiN, TiCN, WN, CoSiN, WSiN, TaN, TaCN, and TaSiN. The switching pattern SW and the variable resistance pattern VR may include substantially the same materials of the switching pattern SW and the variable resistance pattern VR that are discussed with reference to FIGS. 2 and 3.

Each of the key patterns KP may include the same material as that of at least one of the first electrode BE, the switching pattern SW, the second electrode ME, the first metal pattern BM1, the variable resistance pattern VR, the second metal pattern BM2, and the third electrode TE that are included in each of the memory cells MC. For example, the first dummy electrode 121D, the dummy switching pattern 122D, the second dummy electrode 123D, the first dummy metal pattern 126D, the dummy variable resistance pattern 127D, the second dummy metal pattern 128D, and the third dummy electrode 129D that are included in each of the key patterns KP may respectively include the same materials as those of the first electrode BE, the switching pattern SW, the second electrode ME, the first metal pattern BM1, the variable resistance pattern VR, the second metal pattern BM2, and the third electrode TE that are included in each of the memory cells MC.

The key patterns KP may include edge key patterns KPe that are spaced apart from each other in the first direction D1, and may also include central key patterns KPc that are spaced apart from each other in the first direction D1 between the edge key patterns KPe. Each of the key patterns KP may have a width in the first direction D1, and a width W_KPc of each of the central key patterns KPc may be greater than a width W_KPe of each of the edge key patterns KPe. For example, the width W_KPc of each of the central key patterns KPc may be about three times the width W_KPe of each of the edge key patterns KPe. The key mask patterns 200K may have portions (e.g., residues of the central key mask patterns 200Kc) that correspondingly remain on the central key patterns KPc.

Each of the memory cells MC may have a width W_MC in the first direction D1. The width W_KPc of each of the central key patterns KPc may be greater than the width W_MC of each of the memory cells MC. For example, the width W_KPc of each of the central key patterns KPc may be about three times the width W_MC of each of the memory cells MC. The width W_KPe of each of the edge key patterns KPe may be the same as the width W_MC of each of the memory cells MC.

A first interlayer dielectric layer 250 may be formed on the substrate 100 of the key and cell regions R1 and R2. The first interlayer dielectric layer 250 may cover the key patterns KP and the conductive pattern 105, and may fill a space between the key patterns KP. The first interlayer dielectric layer 250 may cover the memory cells MC, the first conductive lines CL1, and the lower dielectric layer 110 between the first conductive lines CL1, and may fill a space between the memory cells MC. The first interlayer dielectric layer 250 may include, for example, at least one selected from SiN, SiON, SiC, SiCN, SiOC, SiOCN, $SiO_2$, $Al_2O_3$, SiBN, AlN, and AlON. The first interlayer dielectric layer 250 may be formed by, for example, one or more of flowable chemical vapor deposition (FCVD), spin on coating (SOG), atomic layer deposition (ALD), chemical vapor deposition (CVD), and physical vapor deposition (PVD). The first interlayer dielectric layer 250 may have a single-layered structure or a multi-layered structure in which a plurality of layers are stacked.

Figure 37:
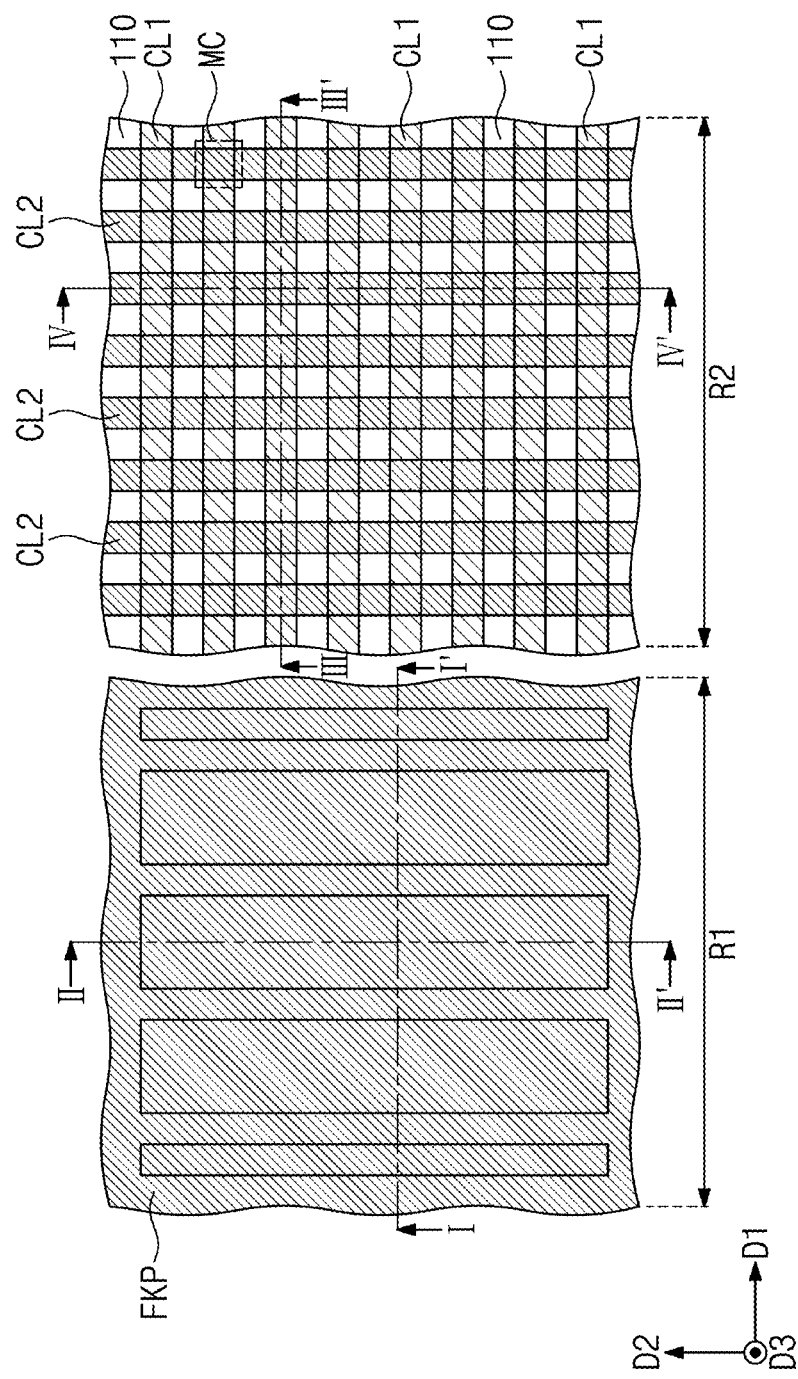
Figure 38:
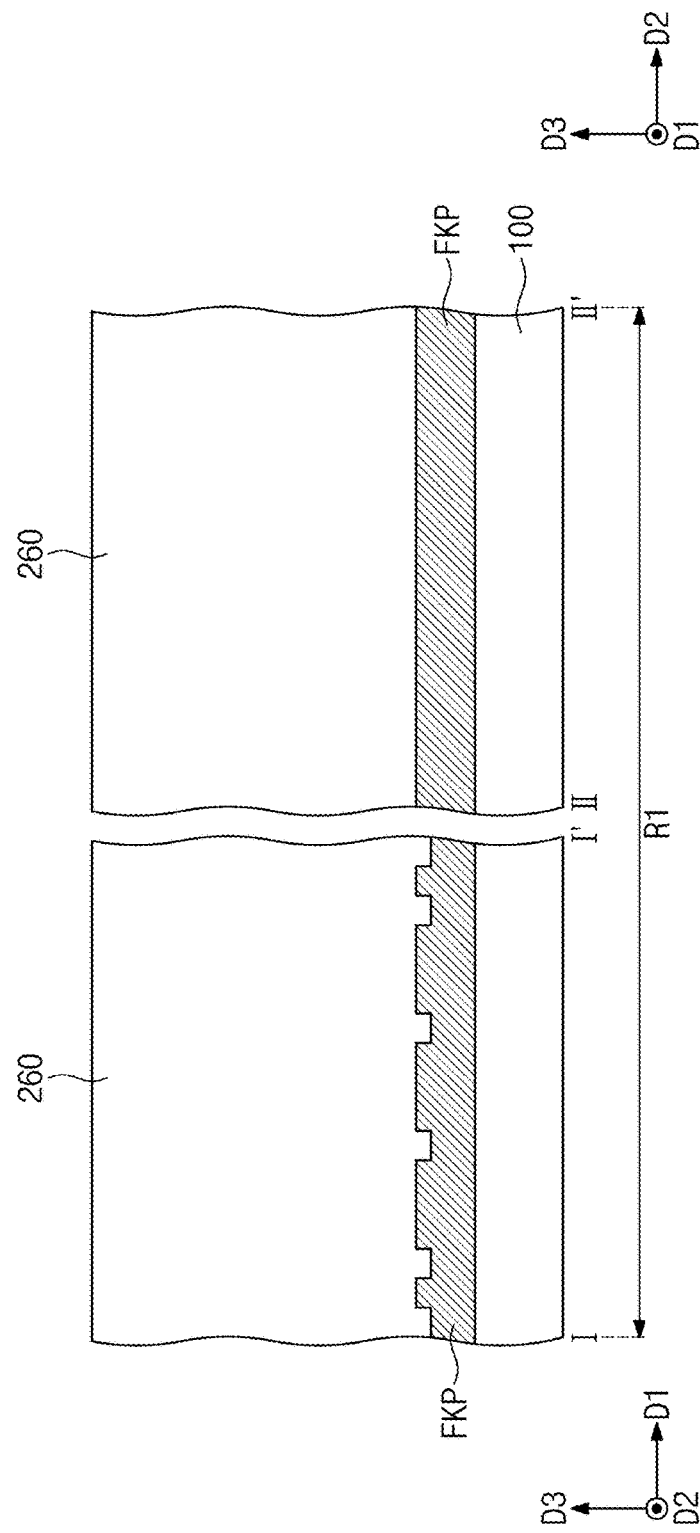
Figure 39:
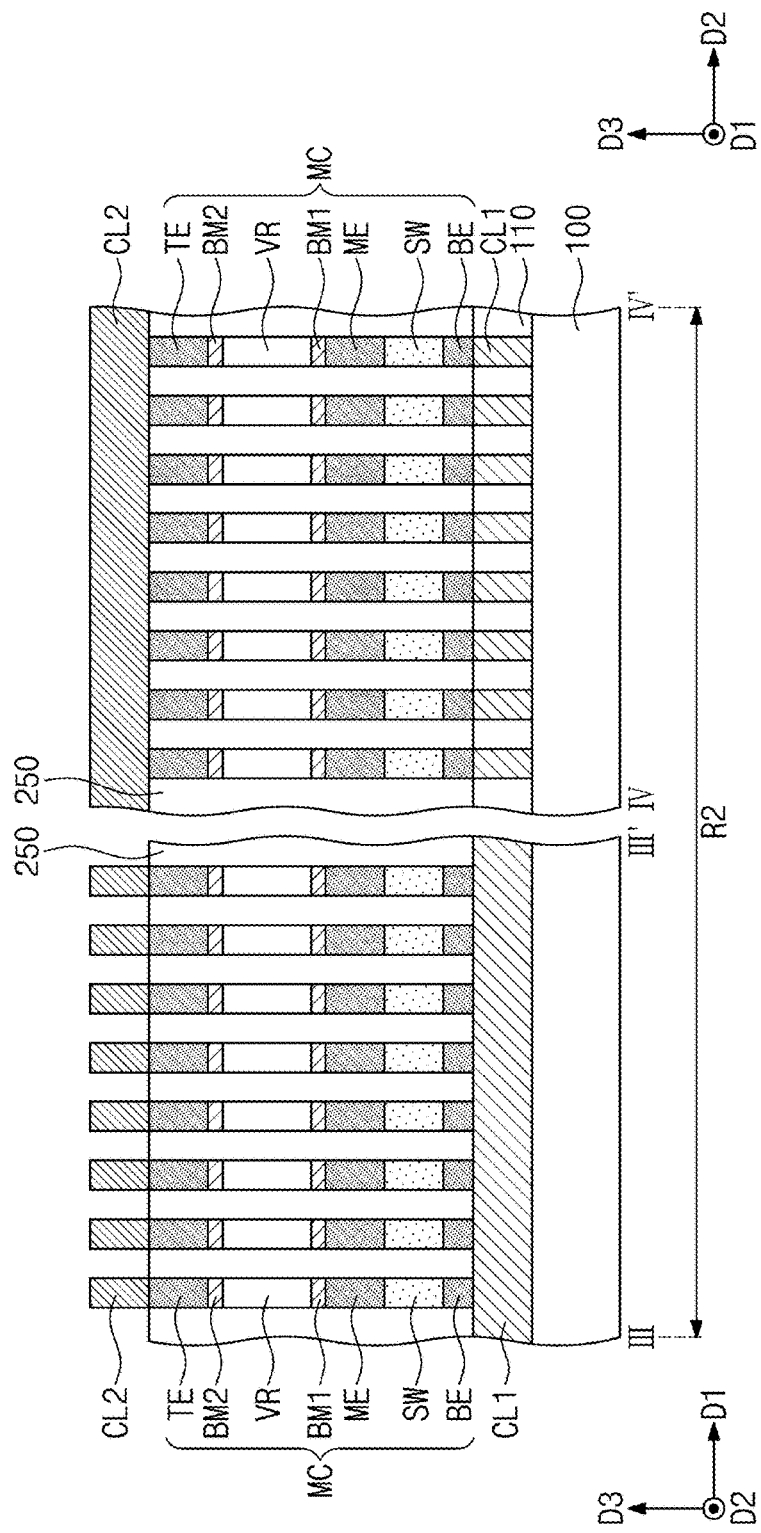

Referring to FIGS. 37 to 39, according to some embodiments, an etching process may be subsequently performed to etch the first interlayer dielectric layer 250 on the key region R1, the protection patterns 130P on the key region R1, the key patterns KP, and an upper portion of the conductive pattern 105. At least portions of the key patterns KP may serve as an etching mask during the subsequent etching process, and thus shapes of the key patterns KP may be transferred to the upper portion of the conductive pattern 105. A final key pattern FKP may be defined to denote the conductive pattern 105 to which the shapes of the key patterns KP are transferred. According to some embodiments, differently from that shown, at least portions of the key patterns KP may remain on the conductive pattern 105. In this case, the at least portion of the key patterns KP may be used as a final key pattern.

A second interlayer dielectric layer 260 may be formed on the substrate 100 of the key region R1, thereby covering the final key pattern FKP. The second interlayer dielectric layer 260 may include, for example, one or more of silicon oxide, silicon nitride, and silicon oxynitride. An interlayer dielectric layer 250 and 260 may be constituted by the first interlayer dielectric layer 250 on the cell region R2 and the second interlayer dielectric layer 260 on the key region R1, and may cover the final key pattern FKP and the memory cells MC.

The interlayer dielectric layer 250 and 260 may undergo a planarization process to remove the protection patterns 130P on the cell region R2. The planarization process may expose a top surface of the third electrode TE included in each of the memory cells MC.

Second conductive lines CL2 may be formed on the interlayer dielectric layer 250 of the cell region R2. The second conductive lines CL2 may be spaced apart in the third direction D3 from the first conductive lines CL1, and may run across the first conductive lines CL1. The second conductive lines CL2 may be spaced apart from each other in the first direction D1 and may be elongated in the second direction D2. The memory cells MC may be disposed between the first conductive lines CL1 and the second conductive lines CL2, and may be correspondingly placed at intersections between the first conductive lines CL1 and the second conductive lines CL2. The second conductive lines CL2 may include one or more of metal (e.g., copper, tungsten, or aluminum) and metal nitride (e.g., tantalum nitride, titanium nitride, or tungsten nitride).

The formation of the second conductive lines CL2 may include, for example, forming a conductive layer on the interlayer dielectric layer 250 and 260, forming mask patterns on the conductive layer of the cell region R2, and using the mask patterns as an etching mask to etch the conductive layer. The final key pattern FKP may be used as an alignment key or an overlay key in a photolithography process for forming the second conductive lines CL2.

According to inventive concepts, the key patterns KP may be formed by patterning the cell stack layer 120 using the key mask patterns 200K as an etching mask. In this case, the key patterns KP may be formed as a bulk-type key whose structure is similar to that of the memory cells MC, and the final key pattern FKP to which the shapes of the key patterns KP are transferred may also be formed as a bulk-type key. The bulk-type key patterns KP (or the bulk-type final key pattern FKP) may be used as an alignment key or an overlay key in a photolithography process for forming the second conductive lines CL2, and in this case, misalignment errors may be minimized between the second conductive lines CL2 and the memory cells MC.

Moreover, the key patterns KP and the memory cells MC may be simultaneously formed by patterning the cell stack layer 120 using the key mask patterns 200K and the cell mask patterns 200C as an etching mask. In this case, it may be easy to form the bulk-type key patterns KP (or the bulk-type final key pattern FKP).

Accordingly, it may be possible to easily fabricate a three-dimensional semiconductor memory device whose process defects are minimized.

While some embodiments of inventive concepts have been described, inventive concepts are not limited to the embodiments described above, and it will be understood by one of ordinary skill in the art that variations in form and detail may be made therein without departing from the spirit and essential features of inventive concepts.

What is claimed is:

1. A method of fabricating a three-dimensional semiconductor memory device, the method comprising:
   providing a substrate that includes a key region and a cell region;
   forming a cell stack layer on the substrate, the cell stack layer covering the key region and the cell region, the cell stack layer including a variable resistance layer and a switching layer that are vertically stacked on the substrate;
   forming a plurality of key mask patterns and a plurality of cell mask patterns on the substrate, the plurality of key mask patterns being spaced apart from each other in a first direction on the cell stack layer on the key region, and the plurality of cell mask patterns being spaced apart from each other in the first direction on the cell stack layer on the cell region; and
   simultaneously forming a plurality of key patterns on the key region and a plurality of memory cells on the cell region by etching the cell stack layer using the plurality of key mask patterns and the plurality of cell mask patterns as an etching mask, wherein
   each of the plurality of memory cells includes a variable resistance pattern and a switching pattern that are formed by etching the variable resistance layer and the switching layer, and
   each of the plurality of key patterns includes a dummy variable resistance pattern and a dummy switching pattern that are formed by etching the variable resistance layer and the switching layer.

2. The method of claim 1, wherein
   the plurality of cell mask patterns are spaced apart from each other in a second direction that intersects the first direction, and
   the plurality of key mask patterns are elongated in the second direction.

3. The method of claim 1, wherein
   on the cell region, the plurality of memory cells are spaced apart from each other in the first direction and a second direction that intersects the first direction, and
   on the key region, the plurality of key patterns are spaced apart from each other in the first direction and are elongated in the second direction.

4. The method of claim 1, wherein the simultaneously forming the plurality of key mask patterns and the plurality of cell mask patterns includes:
   forming a first preliminary key mask pattern on the cell stack layer on the key region;
   forming a plurality of first preliminary cell mask patterns on the cell stack layer on the cell region;
   forming a plurality of second preliminary key mask patterns on the first preliminary key mask pattern, the plurality of second preliminary key mask patterns being spaced apart from each other in the first direction and elongated in a second direction that intersects the first direction;
   forming a plurality of second preliminary cell mask patterns on the plurality of first preliminary cell mask patterns, the plurality of second preliminary cell mask patterns crossing the plurality of first preliminary cell mask patterns; and
   etching the first preliminary key mask pattern and the plurality of first preliminary cell mask patterns using the plurality of second preliminary key mask patterns and the plurality of second preliminary cell mask patterns as an etching mask.

5. The method of claim 4, wherein
   the first preliminary cell mask patterns are elongated in the first direction and are spaced apart from each other in the second direction, and
   the second preliminary cell mask patterns are spaced apart from each other in the first direction and are elongated in the second direction.

6. The method of claim 4, wherein the forming the first preliminary key mask pattern and the forming the first preliminary cell mask patterns includes:
   forming on the cell stack layer a first mask layer that covers the key region and the cell region;
   forming a plurality of first spacer patterns on the first mask layer of the cell region, the plurality of first spacer patterns being elongated in the first direction and spaced apart from each other in the second direction;
   forming a first blocking pattern on the first mask layer of the key region; and
   etching the first mask layer using the first spacer patterns and the first blocking pattern as an etching mask.

7. The method of claim 6, wherein forming the plurality of first spacer patterns includes:
   forming a plurality of first sacrificial patterns on the first mask layer of the cell region, the first sacrificial patterns being elongated in the first direction and spaced apart from each other in the second direction;
   forming a first spacer layer that covers opposite sidewalls of each of the plurality of first sacrificial patterns;
   anisotropically etching the first spacer layer to form the plurality of first spacer patterns; and
   removing the plurality of first sacrificial patterns.

8. The method of claim 6, wherein the first blocking pattern includes a photoresist pattern that is formed by performing a photolithography process after the plurality of first spacer patterns are formed.

9. The method of claim 4, wherein the forming the plurality of second preliminary key mask patterns and the forming the plurality of second preliminary cell mask patterns includes:
forming on the cell stack layer a second mask layer that covers the first preliminary key mask pattern and the first preliminary cell mask patterns;
forming a plurality of second sacrificial patterns on the second mask layer on the key region and the cell region;
forming a second spacer layer on the second mask layer on the key region and the cell region, the second spacer layer covering opposite sidewalls of each of the plurality of second sacrificial patterns;
forming on the key region a second blocking pattern that vertically overlaps portions of the plurality of second sacrificial patterns and a portion of the second spacer layer; and
anisotropically etching the second spacer layer using the second blocking pattern as an etching mask.

10. The method of claim 9, wherein the plurality of second sacrificial patterns are spaced apart from each other in the first direction and are elongated in the second direction.

11. The method of claim 9, wherein the forming the plurality of second preliminary key mask patterns and the forming the plurality of second preliminary cell mask patterns further includes:
forming a plurality of second spacer patterns on opposite sidewalls of each of the plurality of second sacrificial patterns on the cell region through the anisotropic etching of the second spacer layer;
removing a portion of the second spacer layer and portions of the plurality of second sacrificial patterns on the key region through the anisotropically etching the second spacer layer, wherein
neither the portion of the second spacer layer nor the portions of the plurality of second sacrificial patterns vertically overlap the second blocking pattern; and
after the anisotropic etching of the second spacer layer, removing the second blocking pattern and the plurality of second sacrificial patterns on the cell region.

12. The method of claim 11, wherein, after the second blocking pattern and the plurality of second sacrificial patterns on the cell region are removed,
the portions of the plurality of second sacrificial patterns and the portion of the second spacer layer remain on the second mask layer on the key region.

13. The method of claim 12, wherein the forming the plurality of second preliminary key mask patterns and the plurality of second preliminary cell mask patterns further includes etching an upper portion of the second mask layer using the plurality of second spacer patterns, the portions of the plurality of second sacrificial patterns, and the portion of the second spacer layer as an etching mask,
wherein the etching the upper portion of the second mask layer includes exposing a top surface of the first preliminary key mask pattern and top surfaces of the plurality of first preliminary cell mask patterns.

14. The method of claim 1, wherein
the plurality of key mask patterns include a plurality of edge key mask patterns that are spaced apart from each other in the first direction and a plurality of central key mask patterns between the plurality of edge key mask patterns,
each of the plurality of key mask patterns has a width in the first direction, and
a width of each of the plurality of central key mask patterns is greater than a width of each of the plurality of edge key mask patterns.

15. The method of claim 14, wherein
each of the plurality of cell mask patterns has a width in the first direction,
the width of each of the plurality of central key mask patterns is greater than the width of each of the plurality of cell mask patterns.

16. The method of claim 15, wherein the width of each of the plurality of edge key mask patterns is the same as the width of each of the plurality of cell mask patterns.

17. The method of claim 1, further comprising:
forming a plurality of first conductive lines between the substrate and the cell stack layer of the cell region, wherein
the plurality of first conductive lines are horizontally spaced apart from each other, and
wherein each of the plurality of memory cells is connected to a corresponding one of the plurality of first conductive lines.

18. The method of claim 17, further comprising:
forming an interlayer dielectric layer that covers the plurality of key patterns and the plurality of memory cells; and
forming a plurality of second conductive lines on the interlayer dielectric layer of the cell region, the plurality of second conductive lines running across the plurality of first conductive lines,
wherein the plurality of memory cells are at intersections between the plurality of first conductive lines and the plurality of second conductive lines, and
wherein the plurality of key patterns are an alignment key or an overlay key in a photolithography process for forming the plurality of second conductive lines.

19. The method of claim 17, further comprising:
forming a conductive pattern between the substrate and the cell stack layer of the key region;
forming a final key pattern by patterning the conductive pattern using the plurality of key patterns as an etching mask;
forming an interlayer dielectric layer that covers the plurality of memory cells and the final key pattern; and
forming a plurality of second conductive lines on the interlayer dielectric layer of the cell region, the plurality of second conductive lines running across the plurality of first conductive lines,
wherein the memory cells are at intersections between the first conductive lines and the second conductive lines, and
wherein the final key pattern is used as an alignment key or an overlay key in a photolithography process for forming the plurality of second conductive lines.

20. A method of fabricating a three-dimensional semiconductor memory device, the method comprising:
providing a substrate that includes a key region and a cell region;
forming a cell stack layer on the substrate, the cell stack layer covering the key region and the cell region, the cell stack layer including a variable resistance layer and a switching layer that are vertically stacked on the substrate;

forming a plurality of key mask patterns on the cell stack layer on the key region and a plurality of cell mask patterns on the cell stack layer on the cell region; and forming a plurality of key patterns on the key region and a plurality of memory cells on the cell region by etching the cell stack layer using the plurality of key mask patterns and the plurality of cell mask patterns as an etching mask, wherein each of the plurality of memory cells includes a variable resistance pattern and a switching pattern that are formed by etching the variable resistance layer and the switching layer, and wherein each of the plurality of key patterns includes a material that is the same as a material of at least one of the variable resistance pattern and the switching pattern.

\* \* \* \* \*